United States Patent
Park

(10) Patent No.: US 10,388,703 B2
(45) Date of Patent: Aug. 20, 2019

(54) ORGANIC LIGHT EMITTING DISPLAY DEVICE HAVING A PLURALITY PLANARIZING LAYERS OVERLYING THE PIXELS AND METHOD FOR MANUFACTURING THE SAME

(71) Applicant: LG Display Co., Ltd., Seoul (KR)

(72) Inventor: TaeHan Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/816,886

(22) Filed: Nov. 17, 2017

(65) Prior Publication Data

US 2018/0151628 A1    May 31, 2018

(30) Foreign Application Priority Data

Nov. 30, 2016 (KR) .................. 10-2016-0161191

(51) Int. Cl.
*H01L 27/32* (2006.01)
*H01L 51/52* (2006.01)
*H01L 51/56* (2006.01)

(52) U.S. Cl.
CPC ...... *H01L 27/3206* (2013.01); *H01L 27/3211* (2013.01); *H01L 51/5218* (2013.01);
(Continued)

(58) Field of Classification Search
CPC ............. H01L 51/5265; H01L 27/3206; H01L 27/3211; H01L 27/322
(Continued)

(56) References Cited

U.S. PATENT DOCUMENTS

| 8,917,015 B2 * | 12/2014 | Iwata ..................... H05B 33/22 313/504 |
| 2006/0138945 A1 * | 6/2006 | Wolk .................. H01L 27/3211 313/506 |

(Continued)

OTHER PUBLICATIONS

Takase et al., "Photoinduced reversible formation of a superhydrophilic surface by crystal growth of diarylethene," *Chem. Commun.* 52:6885-6887, 2016. (4 pages).
(Continued)

*Primary Examiner* — Lex H Malsawma
*Assistant Examiner* — Eric W Jones
(74) *Attorney, Agent, or Firm* — Seed IP Law Group LLP

(57) ABSTRACT

Disclosed is an OLED device capable of reducing the number of manufacturing processes to apply a micro-cavity structure, and a method for manufacturing the same, wherein the OLED device may include a unit pixel having first to third subpixels, wherein each of the first to third subpixels includes a first electrode, an organic light emitting layer disposed on the first electrode, a second electrode disposed on the organic light emitting layer and formed of a transparent metal material, an encapsulation film for covering the second electrode, and a semi-transmissive electrode disposed on the encapsulation film, wherein a distance between the first electrode and the semi-transmissive electrode in the first subpixel, a distance between the first electrode and the semi-transmissive electrode in the second subpixel, and a distance between the first electrode and the semi-transmissive electrode in the third subpixel are different from one another.

16 Claims, 28 Drawing Sheets

(52) U.S. Cl.
CPC .......... H01L 51/5265 (2013.01); H01L 51/56 (2013.01); *H01L 27/322* (2013.01); *H01L 27/3244* (2013.01); *H01L 2227/32* (2013.01); *H01L 2251/5315* (2013.01)

(58) Field of Classification Search
USPC ..................................................... 257/40, 59
See application file for complete search history.

(56) References Cited

U.S. PATENT DOCUMENTS

| | | | | |
|---|---|---|---|---|
| 2006/0244369 A1* | 11/2006 | Eiichi | ................. | H01L 27/3246 313/504 |
| 2009/0261716 A1* | 10/2009 | Choi | ................... | H01L 27/3213 313/504 |
| 2009/0278450 A1 | 11/2009 | Sonoyama et al. | | |
| 2010/0053043 A1* | 3/2010 | Sakamoto | ........... | H01L 27/3213 345/77 |
| 2011/0229994 A1* | 9/2011 | Jung | ................... | H01L 27/3211 438/29 |
| 2012/0133575 A1* | 5/2012 | Hasegawa | ........... | H01L 51/5265 345/76 |
| 2014/0124767 A1* | 5/2014 | Maindron | ........... | H01L 27/3246 257/40 |
| 2014/0361264 A1* | 12/2014 | Choi | ................... | H01L 51/5275 257/40 |
| 2015/0048316 A1* | 2/2015 | Choi | ................... | H01L 51/5284 257/40 |
| 2015/0349291 A1* | 12/2015 | Song | ................... | H01L 27/3211 257/40 |
| 2016/0248039 A1 | 8/2016 | Choung et al. | | |
| 2016/0322444 A1* | 11/2016 | Kang | ................. | H01L 27/3272 |

OTHER PUBLICATIONS

Tsujioka, T., "Selective Metal-vapor Deposition on Organic Surfaces," *The Chemical Record*, 2015, The Chemical Society of Japan & Wiley-VCH Verlag GmbH & Co. KGaA, Weinheim., *Chem. Rec.* 2016, 16, 231-248, 18 pgs.

* cited by examiner

Open-ring structure      Closed-ring structure

ORGANIC LIGHT EMITTING DISPLAY DEVICE HAVING A PLURALITY PLANARIZING LAYERS OVERLYING THE PIXELS AND METHOD FOR MANUFACTURING THE SAME

CROSS REFERENCE TO RELATED APPLICATIONS

This application claims the benefit of the Korean Patent Application No. 10-2016-0161191 filed on Nov. 30, 2016, which is hereby incorporated by reference as if fully set forth herein.

BACKGROUND

Technical Field

Embodiments of the present disclosure relate to an organic light emitting display device and a method for manufacturing the same.

Description of the Related Art

With the advancement of an information-oriented society, various requirements for the display device of displaying an image are increasing. Thus, various display devices of a liquid crystal display (LCD) devices, a plasma display panel (PDP) devices, and an organic light emitting display (OLED) device have been utilized.

The OLED device is a self light emitting display device. In comparison to the LCD device, the OLED device has wider viewing angle and greater contrast ratio. Also, the OLED device may be fabricated at a lightweight and slim size as it does not need a separate light source unlike the LCD device, and furthermore the OLED device is favorable in view of power consumption. In addition, the OLED device may be driven by a low D.C. voltage, and a response speed of the OLED device is rapid. Especially, the OLED device may have the advantage of low manufacturing cost.

The OLED device may include pixels respectively provided with organic light emitting devices, and a bank for dividing the pixels so as to define the pixels. The bank functions as a pixel defining film. The organic light emitting device may include an anode electrode, a hole transporting layer, an organic light emitting layer, an electron transporting layer, and a cathode electrode. In this case, when a high potential voltage is applied to the anode electrode, and a low potential voltage is applied to the cathode electrode, hole and electron are respectively moved to the organic light emitting layer via the hole transporting layer and the electron transporting layer, and are then combined to each other in the organic light emitting layer, to thereby emit light.

The organic light emitting device may include red, green, and blue organic light emitting layers for emitting red light, green light, and blue light, or may include only white organic light emitting layer for emitting white light. If the organic light emitting device includes only the white organic light emitting layer, the organic light emitting layer is formed as a common layer for the pixels. Accordingly, it is necessary to provide red, green, and blue color filters for realizing red, green, and blue colors, and a black matrix.

In case of the OLED device, the organic light emitting layer deteriorates in accordance with a driving time, causing a lifespan of the organic light emitting layer to be short. Also, a polarizing plate for preventing a reflection of external light is attached to the OLED device, causing some of the light emitted from the organic light emitting layer to be reduced by the polarizing plate. Accordingly, there is a need to provide a method for improving an emission efficiency of light emitted from the organic light emitting layer. In order to improve the emission efficiency, a micro-cavity structure may be applied to the organic light emitting device.

Herein, the micro-cavity indicates that the light-emission efficiency is improved by amplification and constructive interference of the light through repetitive reflection and re-reflection of the light emitted from the organic light emitting layer between the anode and cathode electrodes. In a top emission type where light emits to a direction of the cathode electrode disposed on the anode electrode, the anode electrode is formed of a reflective electrode, and the cathode electrode is formed of a semi-transmissive electrode, it is possible to improve the emission efficiency of light emitted from the organic light emitting layer by the use of micro-cavity structure.

Meanwhile, a wavelength of light in a red pixel emitted through the red color filter, a wavelength of light in a green pixel emitted through the green color filter, and a wavelength of light in a blue pixel emitted through the blue color filter are different from one another. Accordingly, in order to optimize the micro-cavity, a thickness of the anode electrode in the red pixel, a thickness of the anode electrode in the green pixel, and a thickness of the anode electrode in the blue pixel are different from each other so that it is possible to optimize a micro-cavity distance in each of the red, green, and blue pixels. However, a deposition process, a photo process, and an etching process have to be repetitively carried out for each of the red, green, and blue pixels so as to provide the anode electrodes having the different thicknesses in the respective red, green, and blue pixels. That is, if applying the micro-cavity structure, nine manufacturing steps in the process are additionally carried out, frequently each requiring a separate photolithographic set of steps. Accordingly, if applying the micro-cavity structure, the manufacturing process is complicated, and the manufacturing cost is also increased.

SUMMARY

Accordingly, embodiments of the present disclosure are directed to an organic light emitting display device that substantially obviates one or more problems due to limitations and disadvantages of the related art, and a method for manufacturing the same.

An aspect of embodiments of the present disclosure is directed to provide an organic light emitting display device which is capable of reducing the number of manufacturing processes to apply a micro-cavity structure, and a method for manufacturing the same.

Additional advantages and features of embodiments of the disclosure will be set forth in part in the description which follows and in part will become apparent to those having ordinary skill in the art upon examination of the following or may be learned from practice of embodiments of the disclosure. The objectives and other advantages of embodiments of the disclosure may be realized and attained by the structure particularly pointed out in the written description and claims hereof as well as the appended drawings.

To achieve these and other advantages and in accordance with the purpose of embodiments of the disclosure, as embodied and broadly described herein, there is provided an organic light emitting display (OLED) device that may include a pixel having first, second, and third subpixels, wherein each of the first, second, and third subpixels includes a first electrode, an organic light emitting layer disposed on the first electrode, a second electrode disposed on the organic light emitting layer and formed of a transparent metal material, an encapsulation film for covering the second electrode, and a semi-transmissive electrode disposed on the encapsulation film, wherein a distance between the first electrode and the semi-transmissive electrode in the first subpixel, a distance between the first electrode and the semi-transmissive electrode in the second subpixel, and a distance between the first electrode and the semi-transmissive electrode in the third subpixel are different from one another.

In another aspect of an embodiment of the present disclosure, there is provided a method for manufacturing an OLED device that may include forming first electrodes on a first substrate, forming an organic light emitting layer on the first electrodes, forming a second electrode on the organic light emitting layer, and forming an encapsulation film on the second electrode, coating the encapsulation film with photoresist, and disposing a mask having first to third transmitting portions on the photoresist, wherein the first transmitting portion having a first UV transmittance is positioned in an area for a first subpixel, the second transmitting portion having a second UV transmittance, which is lower than the first UV transmittance, is positioned in an area for a second subpixel, and the third transmitting portion having a third UV transmittance, which is lower than the second UV transmittance, is positioned in an area for a third subpixel, forming a first optical auxiliary layer having a first thickness in a first subpixel area, a second optical auxiliary layer having a second thickness in a second subpixel area, and a third optical auxiliary layer having a third thickness in a third subpixel area by irradiating the photoresist with UV, and developing the photoresist irradiated with UV, and forming a semi-transmissive electrode on the first to third optical auxiliary layers.

In another aspect of an embodiment of the present disclosure, there is provided a method for manufacturing an OLED device that may include forming first electrodes on a first substrate, forming an organic light emitting layer on the first electrodes, forming a second electrode on the organic light emitting layer, and forming an encapsulation film on the second electrode, forming a photoreactive organic film on the encapsulation film, disposing a mask having first to third transmitting portions on the photoreactive organic film, and irradiating UV thereonto, wherein the first transmitting portion having a first UV transmittance is positioned in an area for a first subpixel, the second transmitting portion having a second UV transmittance, which is higher than the first UV transmittance, is positioned in an area for a second subpixel, and the third transmitting portion having a third UV transmittance, which is higher than the second UV transmittance, is positioned in an area for a third subpixel, forming a first optical auxiliary layer having a first thickness in the first subpixel, a second optical auxiliary layer having a second thickness in the second subpixel, and a third optical auxiliary layer having a third thickness in the third subpixel by depositing a transparent conductive layer on the photoreactive organic film, and forming a semi-transmissive electrode on the first to third optical auxiliary layers.

In another aspect of an embodiment of the present disclosure, there is provided a method for manufacturing an OLED device that may include forming first electrodes on a first substrate, forming an organic light emitting layer on the first electrodes, forming a second electrode on the organic light emitting layer, and forming an encapsulation film on the second electrode, forming a photoreactive organic film on the encapsulation film, depositing a transparent conductive layer by disposing a first mask having a first transmitting portion for a first subpixel on the photoreactive organic film, and irradiating UV thereonto, depositing the transparent conductive layer by disposing a second mask having a second transmitting portion for a second subpixel on the photoreactive organic film, and irradiating UV thereonto, forming a first optical auxiliary layer having a first thickness in the first subpixel, a second optical auxiliary layer having a second thickness in the second subpixel, and a third optical auxiliary layer having a third thickness in a third subpixel through the transparent conductive layer deposited by disposing a third mask having a third transmitting portion for the third subpixel on the photoreactive organic film, and irradiating UV thereonto, and forming a semi-transmissive electrode on the first to third optical auxiliary layers.

In a further aspect of an embodiment of the present disclosure, there is provided a method for manufacturing an OLED device that may include forming first electrodes on a first substrate, forming an organic light emitting layer on the first electrodes, forming a second electrode on the organic light emitting layer, and forming an encapsulation film on the second electrode, forming a first color filter having a first thickness in an area for a first subpixel on the encapsulation film, forming a second color filter having a second thickness in an area for a second subpixel on the encapsulation film, forming a third color filter having a third thickness in an area for a third subpixel on the encapsulation film, and forming a semi-transmissive electrode on the first to third color filters.

It is to be understood that both the foregoing general description and the following detailed description of embodiments of the present disclosure are exemplary and explanatory and are intended to provide further explanation of the disclosure as claimed.

BRIEF DESCRIPTION OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION

Figure 1:
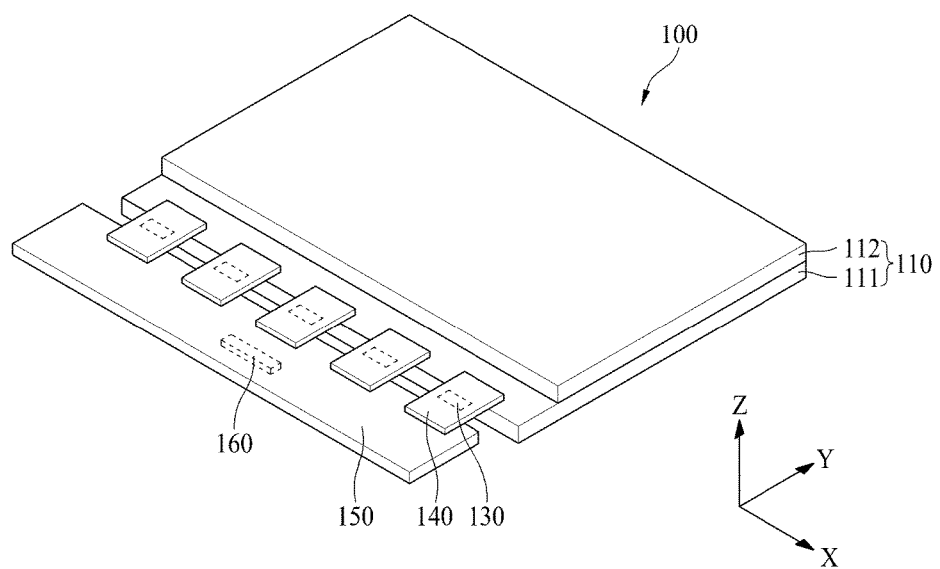
FIG. 1 is a perspective view illustrating an OLED device according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only' is used. The terms of a singular form may include plural forms unless referred to the contrary.

In construing an element, the element is construed as including an error region although there is no explicit description.

In describing a position relationship, for example, when the positional order is described as 'on,' 'above,' 'below,' and 'next,' structures which are not in physical contact may be included unless 'just' or 'direct' is used.

In describing a time relationship, for example, when the temporal order is described as 'after,' 'subsequent,' and 'before,' a sequence which is not continuous or in that order may be included unless 'just' or 'direct' is used in describing particular steps in that sequence.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, "X-axis direction," "Y-axis direction," and "Z-axis direction" are not limited to a perpendicular geometric configuration. That is, "X-axis direction," "Y-axis direction," and "Z-axis direction" may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an organic light emitting display (OLED) device according to the embodiment of the present disclosure and a method for manufacturing the same will be described in detail with reference to the accompanying drawings.

Figure 2:
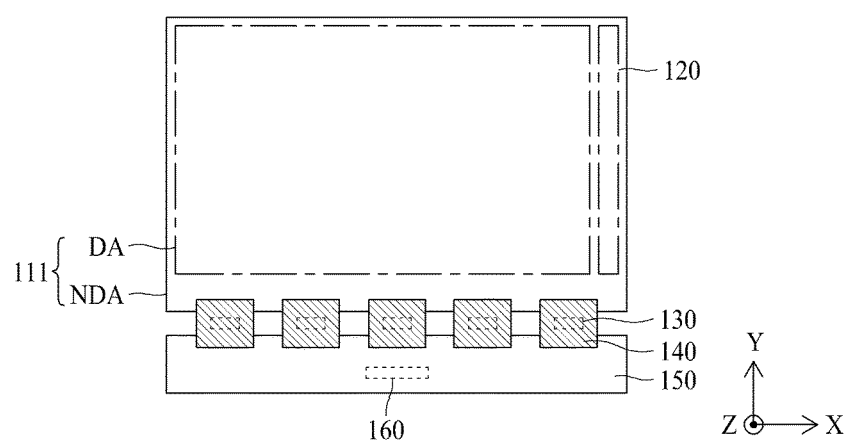
FIG. 2 is a plane view illustrating a first substrate, a gate driver, a source drive IC, a flexible film, a circuit board, and a timing controller of FIG. 1.

FIG. 1 is a perspective view illustrating an OLED device according to one embodiment of the present disclosure. FIG. 2 is a plane view illustrating a first substrate, a gate driver, a source drive IC, a flexible film, a circuit board, and a timing controller of FIG. 1.

Referring to FIGS. 1 and 2, a display device 100 according to one embodiment of the present disclosure may include a display panel 110, a gate driver 120, a source drive integrated circuit (source drive IC) 130, a flexible film 140, a circuit board 150, and a timing controller 160.

The display panel 110 may include a first substrate 111 and a second substrate 112. The second substrate 112 may be an encapsulation substrate. The first substrate 111 may be a plastic film or a glass substrate. The second substrate 112 may be a plastic film, a glass substrate, or an encapsulation film (or protection film).

On one surface of the first substrate 111 confronting the second substrate 112, there are gate lines, data lines and pixels. The pixels are prepared in respective areas defined by crossing the gate lines and the data lines.

Each of the pixels may include a thin film transistor, and an organic light emitting device including a first electrode, an organic light emitting layer, and a second electrode. If a gate signal is supplied from a gate line to each pixel through the thin film transistor, a predetermined current is supplied to the organic light emitting device in accordance with a data voltage of the data line. Accordingly, the organic light emitting device for each of the pixels may emit light with a selected brightness in accordance with the selected drive current. A structure of each of the pixels will be described in detail with reference to FIG. 4.

As shown in FIG. 2, the display panel 110 may include a display area (DA) provided with the pixels for displaying an image, and a non-display area (NDA) in which an image is not displayed. The gate lines, the data lines, and the pixels may be provided in the display area (DA), and the gate driver 120 and pads may be provided in the non-display area (NDA).

The gate driver 120 supplies gate signals to the gate lines in accordance with a gate control signal which is provided from the timing controller 160. The gate driver 120 may be provided in one side of the display area (DA) of the display panel 110, or the non-display area (NDA) of both peripheral sides of the display panel 110 by a gate driver in panel (GIP) method. In another way, the gate driver 120 may be manufactured in a driving chip, may be mounted on the flexible film, and may be attached to one side of the display area (DA) of the display panel 110, or the non-display area (NDA) of both peripheral sides of the display panel 110 by a tape automated bonding (TAB) method.

The source drive IC 130 receives digital video data and source control signals from the timing controller 160. The source drive IC 130 converts the digital video data into analog data voltages in accordance with the source control signal, and supplies the analog data voltages to the data lines. If the source drive IC 130 is manufactured in a driving chip, the source drive IC 130 may be mounted on the flexible film 140 by a chip on film (COF) method or a chip on plastic (COP) method or on the circuit board 150.

The pads such as data pads may be provided in the non-display area (NDA) of the display panel 110. In the flexible film 140, there are lines for connecting the pads with the source drive IC 130, and lines for connecting the pads with the lines of the circuit board 150. The flexible film 140 is attached to the pads by the use of anisotropic conducting film, whereby the pads may be connected with the lines of the flexible film 140.

The circuit board 150 may be attached to the flexible film 140. A plurality of circuits, which are realized in a plurality of driving chips, may be mounted on the circuit board 150. For example, the timing controller 160 may be mounted on the circuit board 150, as well as the gate driver 120, various IC chips 130, or others. The circuit board 150 may be a printed circuit board or a flexible printed circuit board.

The timing controller 160 receives digital video data and a timing signal from an external system board via a cable of the circuit board 150. The timing controller 160 generates the gate control signal for controlling an operation timing of the gate driver 120 and the source control signal for controlling the source drive IC 130 on the basis of the timing signal. The timing controller 160 supplies the gate control signal to the gate driver 120, and supplies the source control signal to the source drive IC 130.

Figure 3:
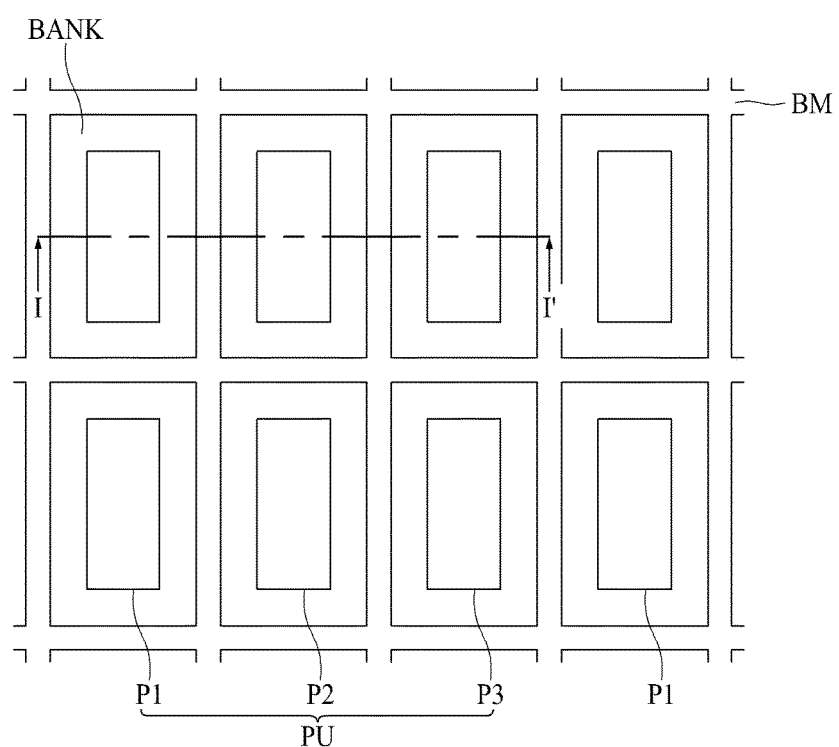
FIG. 3 is a plane view illustrating one example of pixels in a display area.

FIG. 3 is a plane view illustrating one example of the pixels in the display area. For convenience of explanation, FIG. 3 shows only two full pixels, each composed of three subpixels, also called pixels (P1, P2, P3), bank (BANK), and black matrix (BM).

Referring to FIG. 3, each of the pixels (P1, P2, P3) is a light-emission area which is obtained by sequentially depositing a first electrode corresponding to an anode electrode, an organic light emitting layer, and a second electrode corresponding to a cathode electrode. Holes and electrons are respectively supplied from the first electrode and the second electrode, and are then combined with each other in the organic light emitting layer so as to emit light.

The organic light emitting layer of the pixels (P1, P2, P3) may be provided in a common layer for the pixels (P1, P2, P3), to thereby emit white light. In this case, a first color filter is disposed in the first subpixel (P1), a second color filter is disposed in the second subpixel (P2), and a third color filter is disposed in the third subpixel (P3). The first subpixel (P1) emits first-color light by the first color filter, the second subpixel (P2) emits second-color light by the second color filter, and the third subpixel (P3) emits third-color light by the third color filter.

The first to third subpixels (P1, P2, P3) may be defined as a pixel (PU). In this case, the first to third subpixels (P1, P2, P3) may be red, green, and blue pixels, but not limited to this structure. For example, red, green, blue, and white pixels may also be within a full pixel (PU).

The bank (BANK) is provided to divide the pixels (P1, P2, P3), whereby the bank (BANK) serves as a pixel defining film for defining the pixels (P1, P2, P3). The bank (BANK) may be defined as a non-emission area.

The black matrix (BM) is provided to divide the color filters. The black matrix (BM) may be overlapped with the bank (BANK) so as to prevent light of any one pixel from being advancing toward the neighboring pixel and mixed with light of the neighboring pixel.

Figure 4:
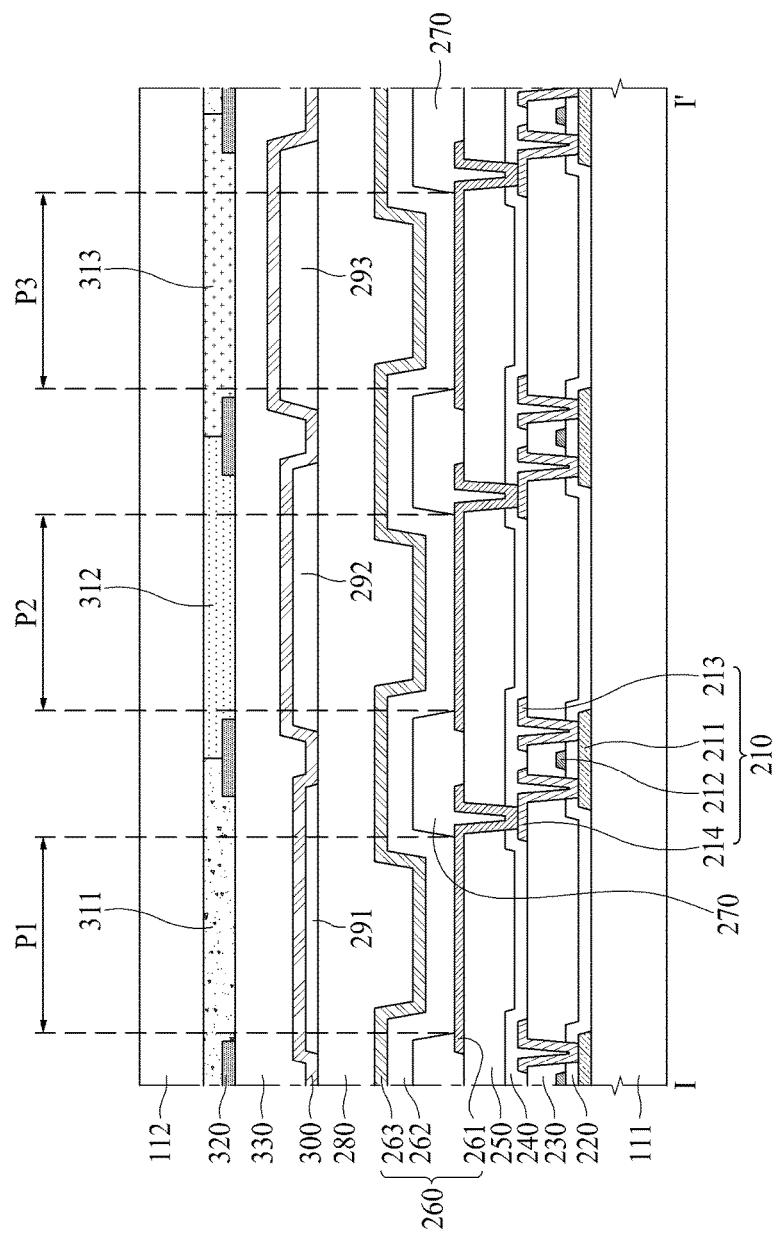
FIG. 4 is a cross sectional view showing one example along I-I' of FIG. 3.

FIG. 4 is a cross sectional view showing one example along I-I' of FIG. 3.

Referring to FIG. 4, a buffer film is provided on one surface of the first substrate 111 facing the second substrate 112. The buffer film (not shown since it is well known) is provided on one surface of the first substrate 111 so as to protect thin film transistors 210 and organic light emitting devices 260 from moisture permeating through the first substrate 111 which is vulnerable to moisture permeability. The buffer film may be formed of a plurality of inorganic films alternately deposited. For example, the buffer film may be formed in a multi-layered structure by alternately depositing at least one inorganic film from a silicon oxide film (SiOx), a silicon nitride film (SiNx), and silicon oxynitride (SiON). It is possible to omit the buffer film, as shown in FIG. 4.

The thin film transistor 210 is provided on the buffer film. The thin film transistor 210 includes an active layer 211, a gate electrode 212, a source electrode 213, and a drain electrode 214. In FIG. 4, the thin film transistor 210 is provided in a top gate type where the gate electrode 212 is positioned above the active layer 211, but not limited to this type. For example, the thin film transistor 210 may be provided in a bottom gate type where the gate electrode 212 is positioned below the active layer 211, or a double gate type where the gate electrode 212 is positioned both above and below the active layer 211.

The active layer 211 is provided on the buffer film. The active layer 211 may be formed a silicon-based semiconductor material or an oxide-based semiconductor material. A light shielding layer may be additionally provided between the buffer film and the active layer 211 so as to block external light being incident on the active layer 211.

A gate insulating film 220 may be provided on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx).

The gate electrode 212 and gate line may be provided on the gate insulating film 220. The gate electrode 212 and gate line may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys.

An insulating interlayer 230 may be provided on the gate electrode 212 and gate line. The insulating interlayer 230 may be formed in a single-layered structure of the inorganic insulating material such as silicon oxide (SiOx) or silicon nitride (SiNx), or a multi-layered structure of the above silicon oxide (SiOx), silicon nitride (SiNx) and their alloys.

The source electrode 213, the drain electrode 214, and the data line may be provided on the insulating interlayer 230. Each of the source electrode 214 and the drain electrode 214 may be connected with the active layer 211 via a contact hole penetrating through the gate insulating film 220 and the insulating interlayer 230. The source electrode 213, the drain electrode 214, and the data line may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys.

A protection film 240 for an insulation of the thin film transistor 210 may be provided on the source electrode 213, the drain electrode 214, and the data line. The protection film 240 may be formed in a single-layered structure of the inorganic material such as silicon oxide (SiOx) or silicon nitride (SiNx), or a multi-layered structure of the above silicon oxide (SiOx) and silicon nitride (SiNx).

A planarization film 250 may be provided on the protection film 240 so as to planarize a step difference area caused by the thin film transistor 210. The planarization film 250 may be formed of an organic material, for example, acryl resin, epoxy resin, phenolic resin, polyamide resin, polyimide resin, and etc.

The organic light emitting device 260 and the bank 270 are provided on the planarization film 250. The organic light emitting device 260 may include the first electrode 261, the organic light emitting layer 262, and the second electrode 263. The first electrode 261 may serve as an anode electrode, and the second electrode 263 may serve as a cathode electrode.

The first electrode 261 may be provided on the planarization film 250. The first electrode 261 may be connected with the source electrode 213 of the thin film transistor 210 via a contact hole penetrating through the protection film 240 and the planarization film 250. The first electrode 261 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO). Herein, the APC alloy is an alloy of argentums (Ag), palladium (Pd), and copper (Cu).

The bank 270 is provided to cover the edge of the first electrode 261 on the planarization film 250, to thereby divide the pixels (P1, P2, P3). That is, the bank 270 functions as a pixel defining film so as to define the pixels (P1, P2, P3).

Each of the pixels (P1, P2, P3) indicates a light-emission area, wherein the first electrode corresponding to the anode electrode, the organic light emitting layer, and the second electrode corresponding to the cathode electrode are sequentially deposited in each pixel. Holes and electrons are respectively supplied from the first electrode and the second electrode, and are then combined with each other in the organic light emitting layer so as to emit light. In this case, the area for the bank 270 does not emit light, thus the area for the bank 270 may be defined as a non-emission area.

The bank 270 may be formed of an organic material, for example, acryl resin, epoxy resin, phenolic resin, polyamide resin, polyimide resin, and etc.

The organic light emitting layer 262 is provided on the first electrode 261 and the bank 270. The organic light emitting layer 262 is a common layer provided on the pixels (P1, P2, P3) in common. The organic light emitting layer may be a white light emitting layer for emitting white light. In this case, the organic light emitting layer 262 may have a tandem structure of 2 stacks or more than 2 stacks. Each stack may include a hole transporting layer, at least one light emitting layer, and an electron transporting layer.

Between each of the stacks, there may be a charge generation layer. The charge generation layer may include an n-type charge generation layer positioned adjacent to the lower stack, and a p-type charge generation layer provided on the n-type charge generation layer and positioned adjacent to the upper stack. The n-type charge generation layer injects the electron into the lower stack, and the p-type charge generation layer injects the hole into the upper stack. The n-type charge generation layer may be formed of an organic layer obtained by doping an organic host material having an electron transporting capacity with alkali metal such as lithium (Li), natrium (Na), kalium (K) or cesium (Cs), or alkali earth metal such as magnesium (Mg), strontium (Sr), barium (Ba) or radium (Ra). The P-type charge generation layer may be formed of an organic layer obtained by doping an organic host material having a hole transporting capacity with dopant.

The second electrode 263 is provided on the organic light emitting layer 262. The second electrode 263 is a common layer provided on the pixels (P1, P2, P3) in common. The second electrode 263 may be formed of a transparent metal material (transparent conductive material, TCO) capable of transmitting light therethrough, for example, Indium Tin Oxide (ITO) or Indium Zinc Oxide (IZO). A capping layer may be provided on the second electrode 263.

An encapsulation film 280 is provided on the second electrode 263. The encapsulation film 280 may prevent a permeation of oxygen or moisture into the organic light emitting layer 262 and the second electrode 263. The encapsulation film 280 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide.

Also, the encapsulation film 280 may include at least one organic film. The organic film may be formed at a thickness enough to prevent particles from getting into the organic light emitting layer 262 and the second electrode 263 through the encapsulation film 280.

Then, first, second, and third optical auxiliary layers 291, 292, and 293 are provided on the encapsulation film 280. The first optical auxiliary layer 291 may be disposed in the first subpixel area, the second optical auxiliary layer 292 may be disposed in the second subpixel area, and the third optical auxiliary layer 293 may be disposed in the third subpixel area. The first optical auxiliary layer 291, the second optical auxiliary layer 292, and the third optical auxiliary layer 293 may have the different thicknesses from one another. The first to third optical auxiliary layers 291, 292, and 293 may be formed of an organic film such as photoresist.

A semi-transmissive layer 300 is provided on the first to third optical auxiliary layers 291, 292, and 293. The semi-transmissive layer 300 may be formed of a semi-transmissive conductive material such as magnesium (Mg), argentums (Ag), or alloy of magnesium (Mg) and argentums (Ag). The layer 300 has the properties of transmitting some of the light and reflecting some of the light. In one embodiment, the layer 300 is not connected to any voltage or power supply and thus is electrically isolated from all other electrodes. In this embodiment, it does not act as electrode or an electrical conductor within the structure. In other embodiments, it may be desired to ground layer 300 to remove any stray electrical charges or instead to connect it to a positive or negative voltage to hold the layer 300 at some selected voltage level.

According to the embodiment of the present disclosure, the first electrode 261 is formed of the metal material with high reflectance, and the semi-transmissive layer 300 is formed of the semi-transmissive metal material, whereby it is possible to realize a micro-cavity structure by the first electrode 261 and the semi-transmissive layer 300, to thereby improve an emission efficiency of light emitted from the organic light emitting layer 262. Herein, the micro-cavity indicates that the light-emission efficiency is improved by amplification and constructive interference of the light through repetitive reflection and re-reflection of the light emitted from the organic light emitting layer 262 between the first electrode 261 and the semi-transmissive layer 300. Also, the first optical auxiliary layer 291 of the first subpixel (P1), the second optical auxiliary layer 292 of the second subpixel (P2), and the third optical auxiliary layer 293 of the third subpixel (P3) have the different thicknesses from one another, whereby it is possible to custom select a micro-cavity distance in each of the first to third subpixels (P1, P2, P3).

An overcoat layer 330 may be provided on the semi-transmissive layer 300 so as to planarize a step difference area caused by the first to third optical auxiliary layers 291, 292, and 293.

Then, the color filters 311, 312, and 313 and the black matrix 320 are provided on the overcoat layer 330. If the color filters 311, 312, and 313 and the black matrix 320 are provided on the overcoat layer 330 instead of the second substrate 112, there is no need for an alignment process when the first and second substrates 111 and 112 are bonded to each other, whereby it is possible to reduce a thickness of a display panel since there is no need for the additional adhesion layer.

The black matrix 320 may be disposed between each of the color filters 311, 312, and 313 so as to prevent light of any one pixel from being advancing toward the neighboring pixel and mixed with light of the neighboring pixel. Also, the black matrix 320 may be overlapped with the bank 270 corresponding to the non-emission area.

The respective color filters 311, 312, and 313 may be disposed in the pixels (P1, P2, P3). For example, as shown in FIG. 4, the first color filter 311 may be disposed in the first subpixel (P1), the second color filter 312 may be disposed in the second subpixel (P2), and the third color filter 313 may be disposed in the third subpixel (P3).

Meanwhile, FIG. 4 shows that the color filters 311, 312, and 313 and the black matrix 320 are provided on the overcoat layer 330, but not limited to this structure. For example, the color filters 311, 312, and 313 and the black matrix 320 may be provided on the semi-transmissive layer 300, and the overcoat layer 330 may be provided on the color filters 311, 312, and 313, or it is possible to omit the overcoat layer 330.

The second substrate 112 is disposed on the color filters 311, 312, and 313. The second substrate 112 may be a plastic film, a glass substrate, or an encapsulation film (protection film).

According to the embodiment of the present disclosure, the first electrode 261 is formed of the metal material with high reflectance, and the semi-transmissive layer 300 is formed of the semi-transmissive metal material, whereby it is possible to realize the micro-cavity structure by the first electrode 261 and the semi-transmissive layer 300, to thereby improve the emission efficiency of light emitted from the organic light emitting layer 262.

Also, the first optical auxiliary layer 291 of the first subpixel (P1), the second optical auxiliary layer 292 of the second subpixel (P2), and the third optical auxiliary layer 293 of the third subpixel (P3) have the different thicknesses from one another, thus making it possible to custom select the micro-cavity distance in each of the first to third subpixels (P1, P2, P3).

In this embodiment of the present disclosure, the first optical auxiliary layer 291 has the smallest thickness, and the third optical auxiliary layer 293 has the largest thickness, but it is not limited to this structure. That is, the thickness in each of the first to third optical auxiliary layers 291, 292, and 293 may be designed to be within an optimum range through a pretest in consideration of a wavelength of the light emitted from the pixels, the color of each filter 311, 312, and 313 and a distance between the first electrode 261 and the semi-transmissive layer 300.

Figure 5:
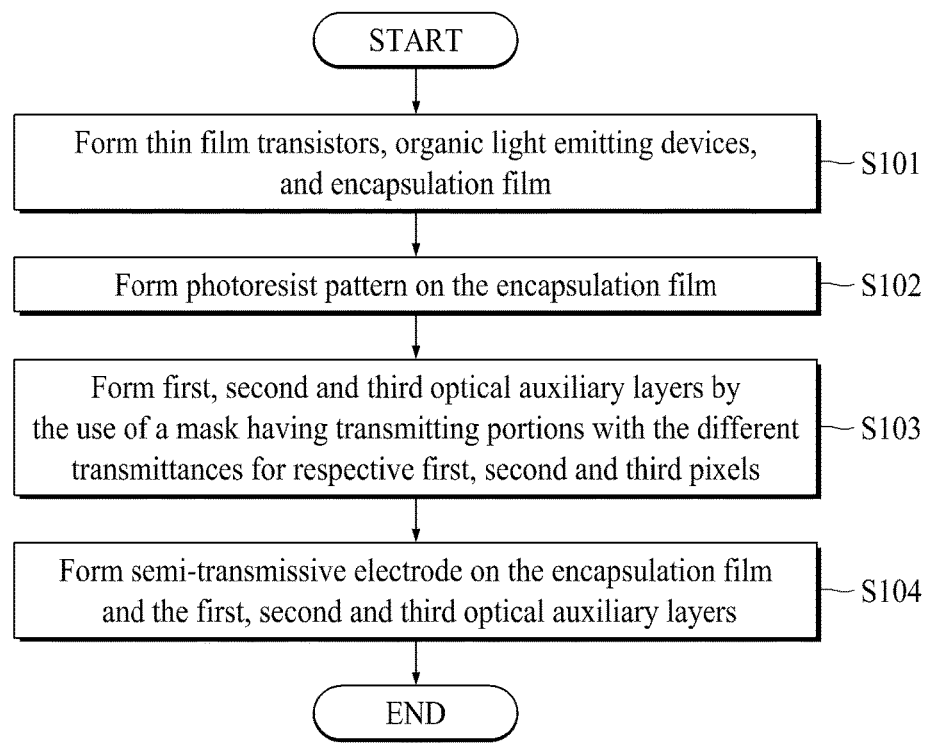
FIG. 5 is a flow chart illustrating a method for manufacturing an OLED device according to one embodiment of the present disclosure.

FIG. 5 is a flow chart illustrating a method for manufacturing an OLED device according to one embodiment of the present disclosure. FIGS. 6A to 6D are cross sectional views illustrating the method for manufacturing the OLED device according to one embodiment of the present disclosure.

The cross sectional views shown in FIGS. 6A to 6D relate to the method for manufacturing the OLED device shown in FIG. 4, whereby the same reference numbers will be used throughout the drawings to refer to the same or like parts. Hereinafter, the method for manufacturing the OLED device according to one embodiment of the present disclosure will be described with reference to FIGS. 5 and 6A to 6D.

Figure 6A:
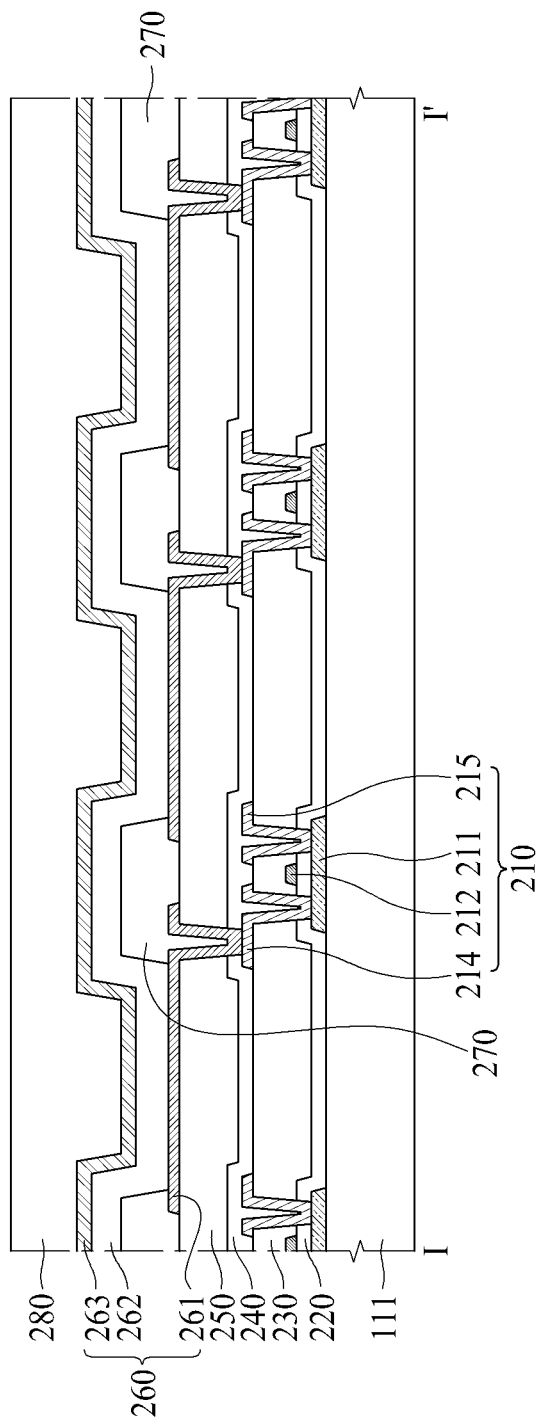
FIGS. 6A to 6D are cross sectional views illustrating the method for manufacturing the OLED device according to one embodiment of the present disclosure.
Figure 6B:
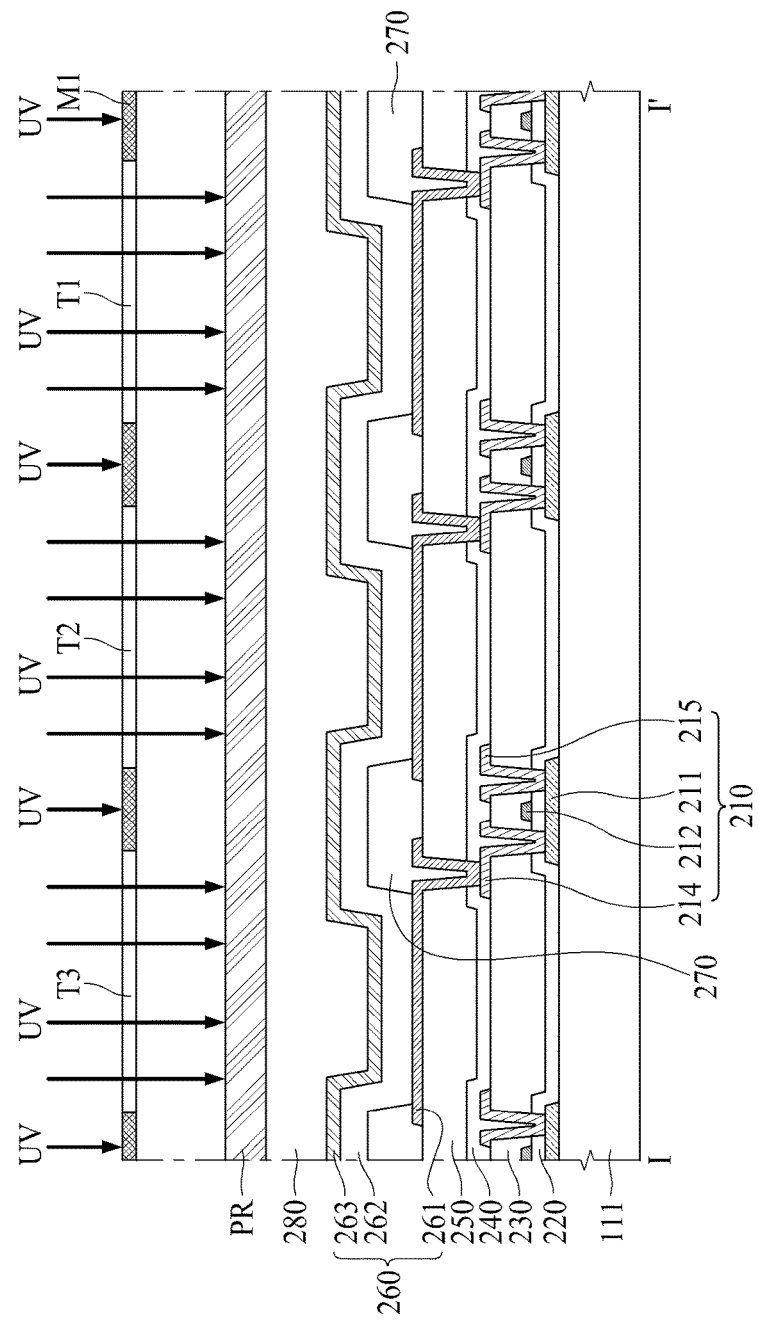

Firstly, as shown in FIG. 6A, the thin film transistors 210, the organic light emitting devices 260, and the encapsulation film 280 are provided.

In detail, the buffer film may be provided on the first substrate 111 so as to protect the thin film transistor 210 and the organic light emitting device 260 from the moisture permeating through the first substrate 111 which is vulnerable to the moisture. The buffer film may be formed of the plurality of inorganic films deposited alternately. For example, the buffer film may be formed in a multi-layered structure by alternately depositing at least one inorganic film from a silicon oxide film (SiOx), a silicon nitride film (SiNx), and silicon oxynitride (SiON). The buffer film may be formed by a chemical vapor deposition (CVD) method.

Thereafter, the active layer 211 of the thin film transistor 210 is provided on the buffer film. In detail, an active metal layer is provided on an entire surface of the buffer film by sputtering or metal organic chemical vapor deposition (MOCVD) method, and then the active metal layer is patterned by a mask process using a photoresist pattern, to thereby form the active layer 211. The active layer 211 may be formed of a silicon-based semiconductor material or an oxide-based semiconductor material.

Then, the gate insulating film 220 is provided on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx).

Then, the gate electrode 212 of the thin film transistor 210 is provided on the gate insulating film 220. In detail, a first metal layer is provided on an entire surface of the gate insulating film 220 by sputtering or MOCVD method, and then the first metal layer is patterned by a mask process using a photoresist pattern, to thereby form the gate electrode 212. The gate electrode 212 may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys.

The insulating interlayer 230 is provided on the gate electrode 212. The insulating interlayer 230 may be formed in a single-layered structure of the inorganic insulating material such as silicon oxide (SiOx) or silicon nitride (SiNx), or a multi-layered structure of the above silicon oxide (SiOx) and silicon nitride (SiNx).

Then, the contact holes for exposing the active layer 211 are provided through the gate insulating film 220 and the insulating interlayer 230.

The source and drain electrodes 213 and 214 of the thin film transistor 210 are provided on the insulating interlayer 230. In detail, a second metal layer is provided on an entire surface of the insulating interlayer 230 by sputtering or MOCVD method. Then, the second metal layer is patterned by a mask process using a photoresist pattern. Each of the source and drain electrodes 213 and 214 may be connected with the active layer 211 via the contact hole penetrating through the gate insulating film 220 and the insulating interlayer 230. Each of the source and drain electrodes 213 and 214 may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys.

Then, the protection film 240 is provided on the source and drain electrodes 213 and 214 of the thin film transistor 210. The protection film 240 may be formed in a single-layered structure of the inorganic insulating material such as silicon oxide (SiOx) or silicon nitride (SiNx), or a multi-layered structure of the above silicon oxide (SiOx) and silicon nitride (SiNx). The protection film 240 may be formed by the CVD method.

Then, the planarization film 250 may be provided on the protection film 240 so as to planarize the step difference area caused by the thin film transistor 210. The planarization film 250 may be formed of an organic material, for example, acryl resin, epoxy resin, phenolic resin, polyamide resin, polyimide resin, and etc.

Then, the first electrode 261 of the organic light emitting device 260 is provided on the planarization film 250. In detail, a third metal film is provided on an entire surface of the planarization film 280 by sputtering or MOCVD method, and then the third metal film is patterned by a mask process using a photoresist pattern, to thereby provide the first electrode 261. The first electrode 261 may be connected with the source electrode 213 of the thin film transistor 210 via the contact hole penetrating through the protection film 240 and the planarization film 250. The first electrode 261 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO).

Then, the bank 270 is provided to cover the edge of the first electrode 261 on the planarization film 250, to thereby divide the pixels (P1, P2, P3). The bank 270 may be formed of an organic material, for example, acryl resin, epoxy resin, phenolic resin, polyamide resin, polyimide resin, and etc.

Then, the organic light emitting layer 262 is provided on the first electrode 261 and the bank 270 by a deposition process or solution process. The organic light emitting layer 262 is a common layer provided on the pixels (P1, P2, P3) in common. In this case, the organic light emitting layer may be a white light emitting layer for emitting white light.

If the organic light emitting layer 262 is the white light emitting layer, it may have a tandem structure of 2 stacks or more than 2 stacks. Each stack may include a hole transporting layer, at least one light emitting layer, and an electron transporting layer.

Between each of the stacks, there may be a charge generation layer. The charge generation layer may include an n-type charge generation layer positioned adjacent to the lower stack, and a p-type charge generation layer provided on the n-type charge generation layer and positioned adjacent to the upper stack. The n-type charge generation layer injects the electron into the lower stack, and the p-type charge generation layer injects the hole into the upper stack. The n-type charge generation layer may be formed of an organic layer doped with alkali metal such as lithium (Li), natrium (Na), kalium (K) or cesium (Cs), or alkali earth metal such as magnesium (Mg), strontium (Sr), barium (Ba) or radium (Ra). The P-type charge generation layer may be formed of an organic layer obtained by doping an organic host material having a hole transporting capacity with dopant.

The second electrode 263 is provided on the organic light emitting layer 262. The second electrode 263 may be a common layer provided on the pixels (P1, P2, P3) in common. The second electrode 263 may be formed of a transparent metal material (transparent conductive material, TCO) capable of transmitting light therethrough, for example, Indium Tin Oxide (ITO) or Indium Zinc Oxide (IZO). The second electrode 263 may be formed of a physical vapor deposition method such as sputtering. The capping layer may be provided on the second electrode 263.

Then, the encapsulation film 280 is provided on the second electrode 263. The encapsulation film 280 may prevent a permeation of oxygen or moisture into the organic light emitting layer 262 and the second electrode 263. To this end, the encapsulation film 280 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide.

Also, the encapsulation film 280 may further include at least one organic film. The organic film may be formed at a thickness enough to prevent particles from getting into the organic light emitting layer 262 and the second electrode 263 through the encapsulation film 280 (S101 of FIG. 5).

Secondly, a photoresist (PR) is coated onto the encapsulation film 280 for the first to third subpixels (P1, P2, P3). The photoresist (PR) may be positive photoresist. In case of the positive photoresist, the area irradiated with ultraviolet (UV) rays is removed by a developing solution (S102 of FIG. 5).

Figure 6C:
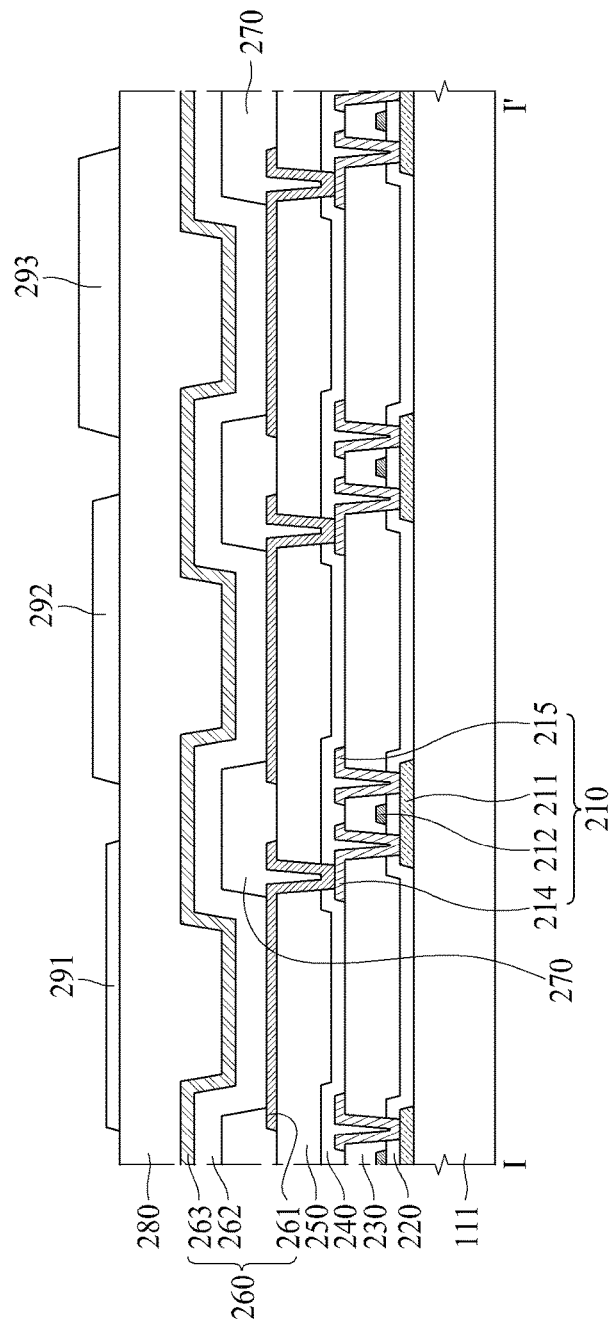

Thirdly, as shown in FIG. 6C, a first mask (M1) having transmitting portions (T1, T2, T3) with the different transmittances is disposed, and then it is irradiated with UV.

In detail, the first mask (M1) is provided with the first transmitting portion (T1) having the first UV transmittance, the second transmitting portion (T2) having the second UV transmittance which is lower than the first UV transmittance, and the third transmitting portion (T3) having the third UV transmittance which is lower than the second UV transmittance. Under the condition that the first mask (M1) is disposed on the photoresist (PR), it is irradiated with UV, and then is developed. In this case, the first transmitting portion (T1) may be positioned in the bank 270, the second transmitting portion (T2) may be positioned in the first subpixel (P1), and the third transmitting portion (T3) may be positioned in the second subpixel (P2).

Accordingly, the first optical auxiliary layer 291 having a first thickness may be provided in the first subpixel area, the second optical auxiliary layer 292 having a second thickness may be provided in the second subpixel area, and the third optical auxiliary layer 293 may be provided in the third subpixel area having a third thickness. An amount of UV irradiation applied to the photoresist (PR) will be different in each of the first to third transmitting portions (T1, T2, T3), whereby the first optical auxiliary layer 291, the second optical auxiliary layer 292 and the third optical auxiliary layer 293 may have the different thicknesses from one another. Because of the different transmittances of the portions T1, T2, and T3, the UV penetrates to a different depth at each location. The resulting layer at each location, after development and removal, will have a different thickness. According as each of the third to third optical auxiliary layers 291, 292, and 293 is removed by the thickness of the photoresist (PR) irradiated with UV through the use of developing solution, the first optical auxiliary layer 291 has the smallest thickness, and the third optical auxiliary layer 293 has the largest thickness (S103 of FIG. 5).

If a positive photoresist is used, exposure to light that will cause the photoresist to be removed. On the other hand, if a negative photoresist is used, exposure to light will cause the photoresist to remain. Therefore, the light transmissive properties of each portion T1, T2 and T3 is selected based on whether it is a positive or negative photoresist and whether it is desired to remove some of the material or to retain the material.

Figure 6D:
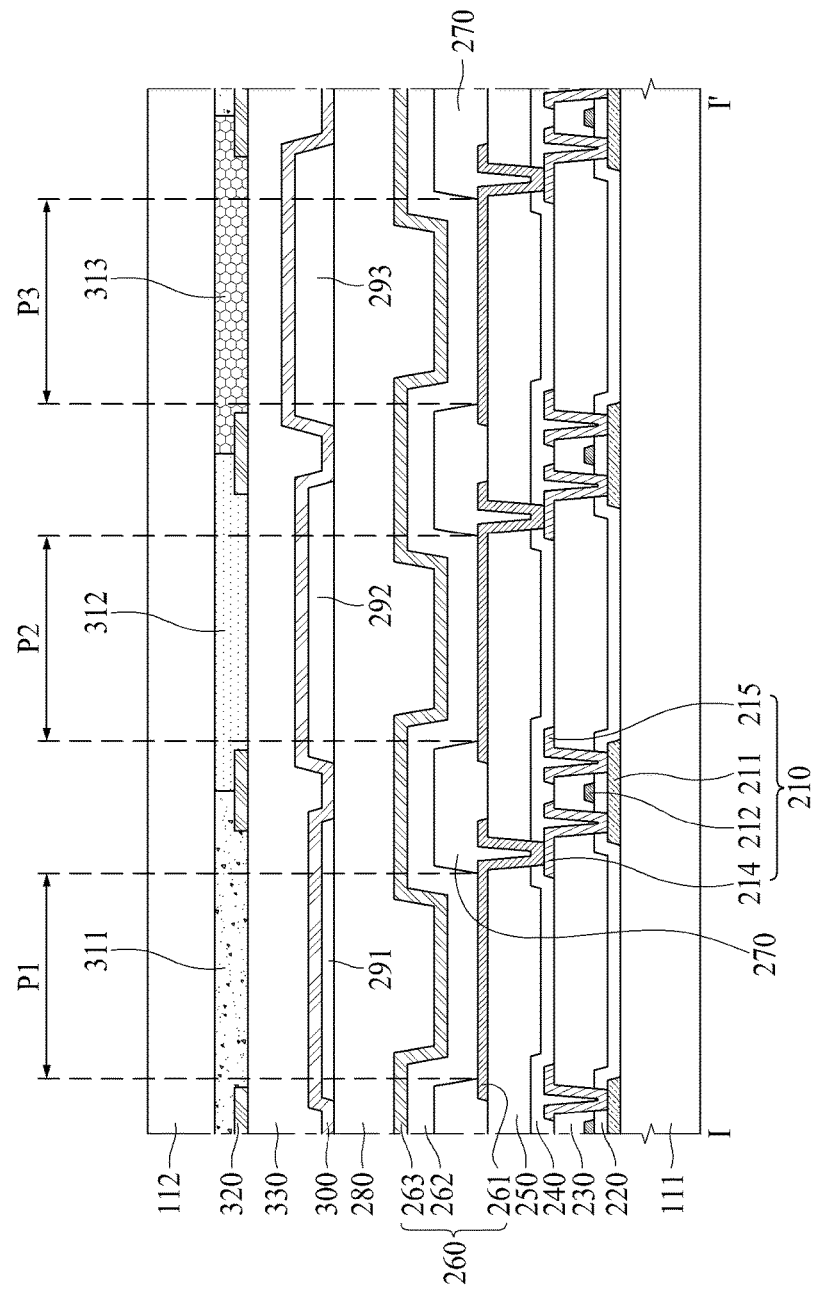

Fourthly, as shown in FIG. 6D, the semi-transmissive layer 300 is provided on the encapsulation film 280, and the first to third optical auxiliary layers 291, 292, and 293. The semi-transmissive layer 300 may be formed of a semi-transmissive conductive material such as magnesium (Mg), argentums (Ag), or alloy of magnesium (Mg) and argentums (Ag).

The overcoat layer 330 may be provided on the semi-transmissive layer 300 so as to planarize the step difference area caused by the first to third optical auxiliary layers 291, 292, and 293.

Then, the color filters 311, 312, and 313 and the black matrix 320 are provided on the overcoat layer 330. If the color filters 311, 312, and 313 and the black matrix 320 are provided on the overcoat layer 330 instead of the second substrate 112, there is no need for an alignment process when the first and second substrates 111 and 112 are bonded to each other, whereby it is possible to reduce a thickness of a display panel since there is no need for the additional adhesion layer.

The black matrix 320 may be disposed between each of the color filters 311, 312, and 313 so as to prevent light of any one pixel from being advancing toward the neighboring pixel and mixed with light of the neighboring pixel. Also, the black matrix 320 may be overlapped with the bank 270 corresponding to the non-emission area.

The respective color filters 311, 312, and 313 may be disposed in the pixels (P1, P2, P3). For example, as shown in FIG. 6D, the first color filter 311 may be disposed in the first subpixel (P1), the second color filter 312 may be disposed in the second subpixel (P2), and the third color filter 313 may be disposed in the third subpixel (P3).

Then, the second substrate 112 is attached onto the color filters 311, 312, and 313. The second substrate 112 may be a plastic film, a glass substrate, or an encapsulation film (protection film) (S104 of FIG. 5).

As described above, the encapsulation film 280 is coated with the photoresist (PR), and then is irradiated with UV by the use of first mask (M1) having the transmitting portions with the different UV transmittances, whereby the first optical auxiliary layer 291 for the first subpixel (P1), the second optical auxiliary layer 292 for the second subpixel (P2), and the third optical auxiliary layer 293 for the third subpixel (P3) may have the different thicknesses from one another. As a result, it is possible to optimize a micro-cavity distance in each of the first to third subpixels (P1, P2, P3) by the two processes including the photoresist (PR) coating process and the patterning process. Accordingly, it is possible to largely reduce the number of manufacturing processes, to thereby simplify the manufacturing process, and to reduce a manufacturing cost.

Figure 7:
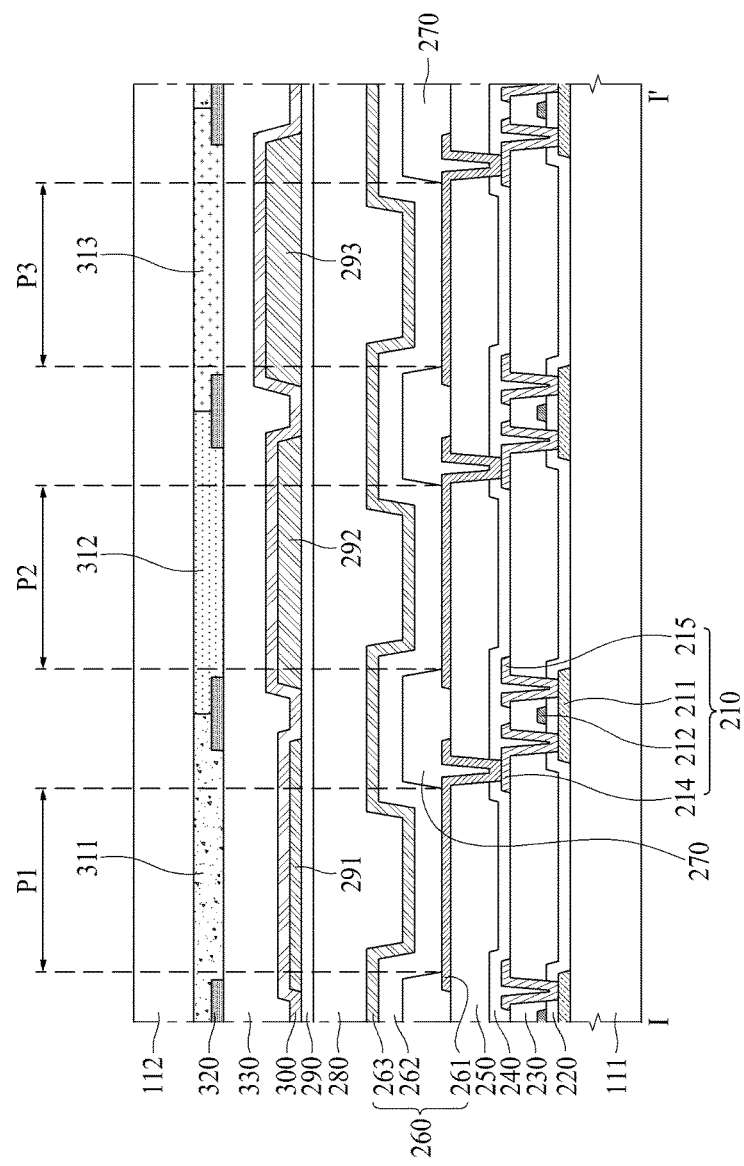
FIG. 7 is a cross sectional view showing another example along I-I' of FIG. 3.

FIG. 7 is a cross sectional view showing another example along I-I' of FIG. 3.

Except a photoreactive organic film 290 and first to third optical auxiliary layers 291, 292, and 293, the cross sectional view shown in FIG. 7 is the same as the cross sectional view shown in FIG. 4. In FIG. 7, a detailed description for the first substrate 111, the thin film transistor 210, the gate insulating film 220, the insulating interlayer 230, the protection film 240, the planarization film 250, the organic light emitting device 260, the bank 270, the encapsulation film 280, the semi-transmissive layer 300, the color filters 311, 312, and 313, the black matrix 320, the overcoat layer 330, and the second substrate 112 will be omitted.

Figure 8:
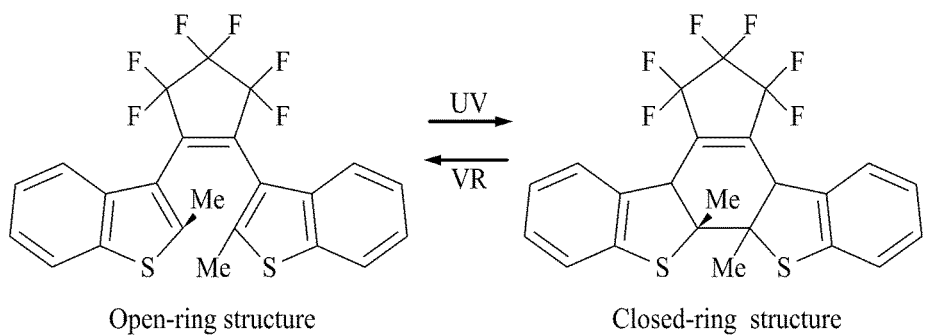
FIG. 8 is a chemical formula showing one example of diarylethene molecules of a photoreactive organic film.

Referring to FIG. 7, the photoreactive organic film 290 is provided on the encapsulation film 280. As shown in FIG. 8, the photoreactive organic film 290 includes diarylethene molecules, so that it has the photo-isomerization properties. As shown in FIG. 8, if the diarylethene molecules are irradiated with ultraviolet rays (hereinafter, referred to as "UV"), its structure is changed from an open-ring structure into a closed-ring structure. Meanwhile, if the diarylethene molecules are irradiated with visible rays (hereinafter, referred to as "VR"), its structure is changed from the closed-ring structure into the open-ring structure.

If the diarylethene molecules have the open-ring structure, the photoreactive organic film 290 has a hydrophobic property by a large amount of fluorine. Thus, if the diarylethene molecules have the open-ring structure, an adhesion property between the photoreactive organic film 290 and the transparent metal material is not good so that it is difficult to deposit the transparent metal material on the photoreactive organic film 290.

If the diarylethene molecules have the closed-ring structure, the fluorine molecules in the surface of the photoreactive organic film 290 are arranged inside the photoreactive organic film 290. Thus, the surface of the photoreactive organic film 290 has a hydrophilic property, whereby the transparent metal material is easily deposited on the photoreactive organic film 290.

If using the photo-isomerization properties in the diarylethene molecules of the photoreactive organic film 290, the transparent conductive layer may be selectively provided on predetermined areas. Accordingly, the photoreactive organic film 290 overlying the first to third subpixels (P1, P2, P3) is irradiated with UV, whereby a first transparent conductive layer corresponding to the first optical auxiliary layer 291 is provided in the area that overlies the first subpixel (P1), a second transparent conductive layer corresponding to the second optical auxiliary layer 292 is provided in the area that overlies the second subpixel (P2), and a third transparent conductive layer corresponding to the third optical auxiliary layer 293 is provided in the area that overlies the third subpixel (P3). The first, second, and third transparent conductive layer may be formed of a transparent metal material (transparent conductive material, TCO) capable of transmitting light therethrough, for example, Indium Tin Oxide (ITO) or Indium Zinc Oxide (IZO).

Especially, it is possible to adjust the thickness of the transparent conductive layer deposited on the photoreactive organic film 290 in accordance with the amount of UV irradiation. According as the amount of UV irradiation is increased, the thickness of the transparent conductive layer deposited on the photoreactive organic film 290 becomes thicker. If the amount of UV irradiation applied to the third subpixel (P3) is the largest, and the amount of UV irradiation applied to the first subpixel (P1) is the smallest, the third optical auxiliary layer 293 has the largest thickness, and the first optical auxiliary layer 291 has the smallest thickness. That is, the first optical auxiliary layer 291, the second optical auxiliary layer 292, and the third optical auxiliary layer 293 may have the different thicknesses from one another.

Then, the semi-transmissive layer 300 is provided on the photoreactive organic film 290, and the first to third optical auxiliary layers 291, 292, and 293. The semi-transmissive layer 300 may be formed of a semi-transmissive conductive material such as magnesium (Mg), argentums (Ag), or alloy of magnesium (Mg) and argentums (Ag).

According to the embodiment of the present disclosure, the first electrode 261 is formed of the metal material with high reflectance, and the semi-transmissive layer 300 is formed of the semi-transmissive metal material, whereby it is possible to realize a micro-cavity structure by the first electrode 261 and the semi-transmissive layer 300, to thereby improve an emission efficiency of light emitted from the organic light emitting layer 262.

According to the embodiment of the present disclosure, the first optical auxiliary layer 291 for the first subpixel (P1), the second optical auxiliary layer 292 for the second subpixel (P2), and the third optical auxiliary layer 293 for the third subpixel (P3) may have the different thicknesses from one another so that it is possible to customize a micro-cavity distance in each of the first to third subpixels (P1, P2, P3).

In this embodiment of the present disclosure, the third optical auxiliary layer 293 has the largest thickness, and the first optical auxiliary layer 291 has the smallest thickness, but not limited to this structure. That is, the thickness in each of the first to third optical auxiliary layers 291, 292, and 293 may be designed to be within an optimum range through building various test structures and testing their operation in consideration of a wavelength of the light emitted from the pixels, and a distance between the first electrode 261 and the semi-transmissive layer 300.

Figure 9:
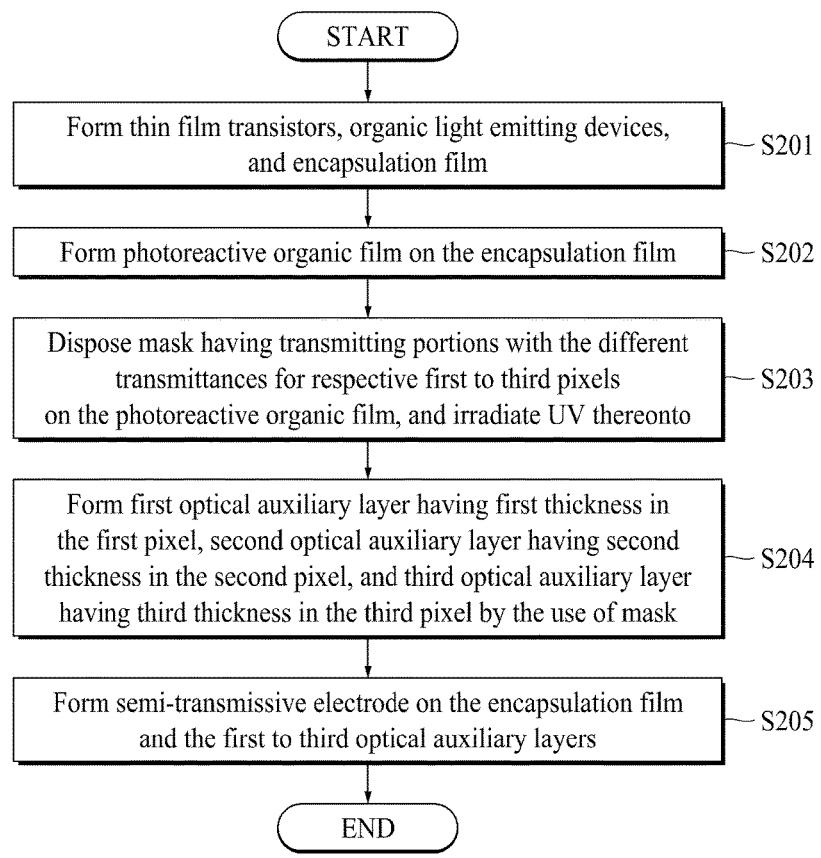
FIG. 9 is a flow chart illustrating a method for manufacturing an OLED device according to another embodiment of the present disclosure.

FIG. 9 is a flow chart illustrating a method for manufacturing an OLED device according to another embodiment of the present disclosure. FIGS. 10A to 10E are cross sectional views illustrating the method for manufacturing the OLED device according to another embodiment of the present disclosure.

The cross sectional views shown in FIGS. 10A to 10E relate to the method for manufacturing the above OLED device shown in FIG. 8, whereby the same reference numbers will be used throughout the drawings to refer to the same or like parts. Hereinafter, the method for manufacturing the OLED device according to another embodiment of the present disclosure will be described in detail with reference to FIG. 9 and FIGS. 10A to 10E.

Figure 10A:
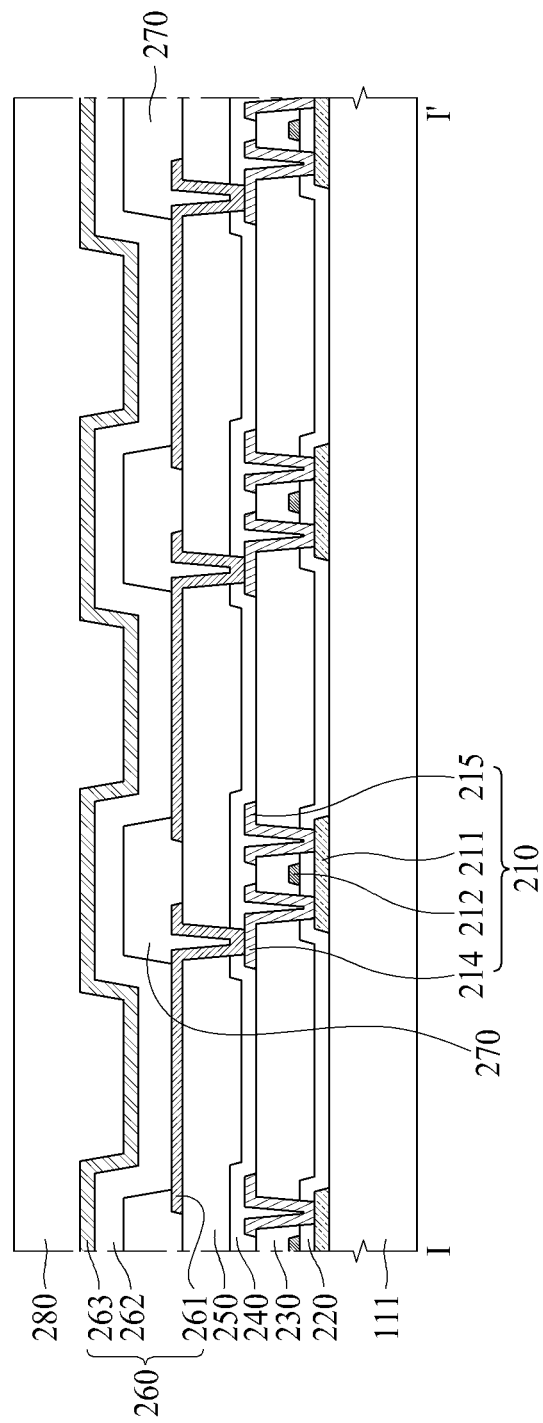
FIGS. 10A to 10E are cross sectional views illustrating the method for manufacturing the OLED device according to another embodiment of the present disclosure.

Firstly, as shown in FIG. 10A, the thin film transistors 210, the organic light emitting devices 260, and the encapsulation film 280 are provided.

The step S201 of FIG. 9 is the same as the step S101 of FIG. 5, whereby a detailed description for the step S201 of FIG. 9 will be omitted (S201 of FIG. 9).

Figure 10B:
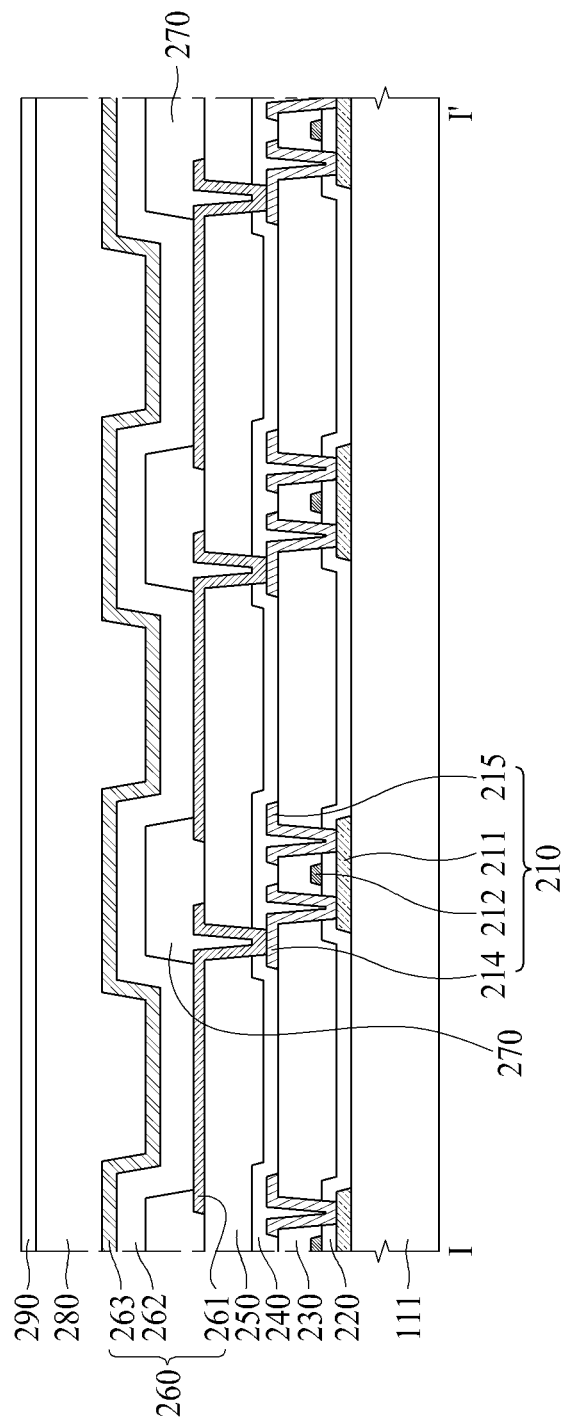

Secondly, as shown in FIG. 10B, the photoreactive organic film 290 is provided on the encapsulation film 280.

In detail, the photoreactive organic film 290 may be a common layer provided on the pixels (P1, P2, P3) in common. As shown in FIG. 10B, the photoreactive organic film 290 includes diarylethene molecules, whereby it has the photo-isomerization properties. As shown in FIG. 8, if the diarylethene molecules are irradiated with ultraviolet rays (hereinafter, referred to as "UV"), its structure is changed from an open-ring structure into a closed-ring structure. Meanwhile, if the diarylethene molecules are irradiated with visible rays (hereinafter, referred to as "VR"), its structure is changed from the closed-ring structure into the open-ring structure.

If the diarylethene molecules have the open-ring structure, the photoreactive organic film 290 has a hydrophobic property by a large amount of fluorine. Thus, if the diarylethene molecules have the open-ring structure, an adhesion property between the photoreactive organic film 290 and the transparent metal material is not good so that it is difficult to deposit the transparent metal material on the photoreactive organic film 290.

If the diarylethene molecules have the closed-ring structure, the fluorine molecules in the surface of the photoreactive organic film 290 are arranged inside the photoreactive organic film 290. Thus, the surface of the photoreactive organic film 290 has a hydrophilic property, whereby the transparent metal material is easily deposited on the photoreactive organic film 290 (S202 of FIG. 9).

Figure 10C:
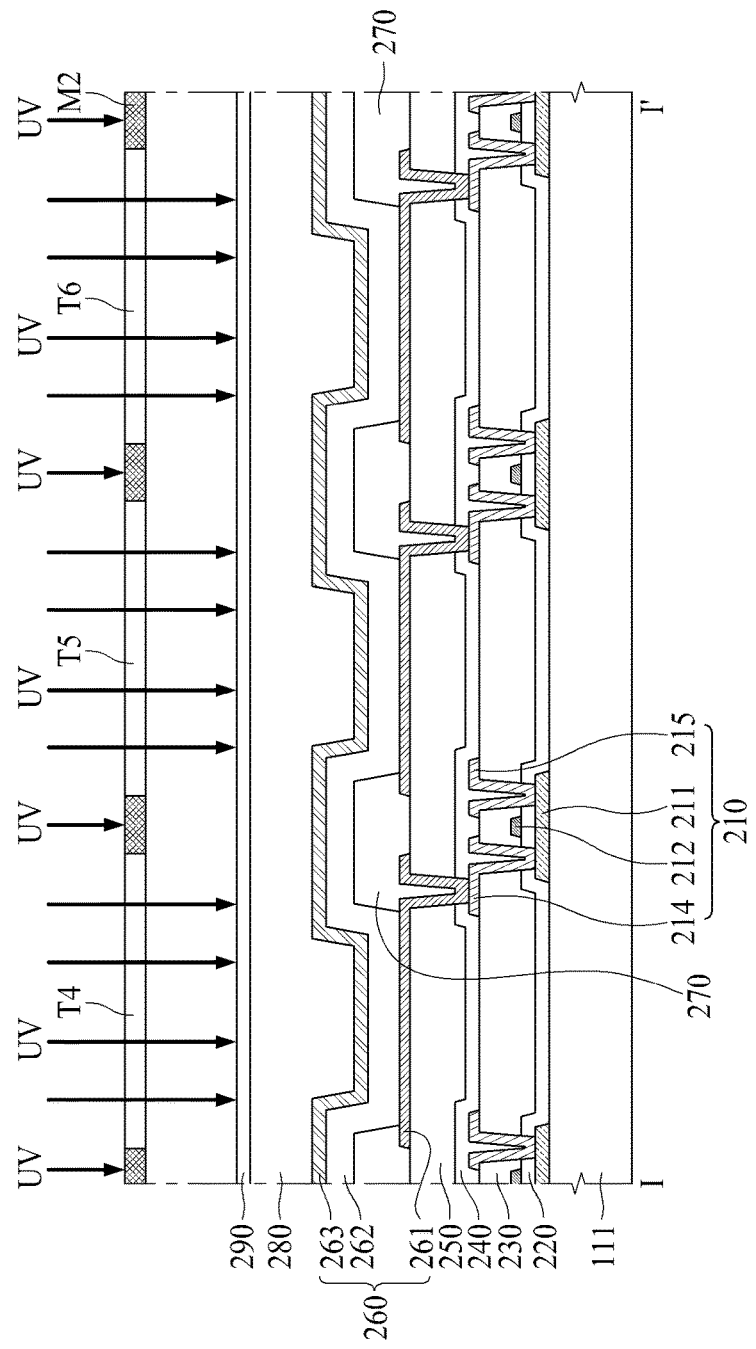

Thirdly, as shown in FIG. 10C, under the condition that a second mask (M2) having transmitting portions (T4, T5, T6) with the different UV transmittances is disposed on the photoreactive organic film 290, it is irradiated with UV.

In detail, the second mask (M2) is provided with the fourth transmitting portion (T4) having the fourth UV transmittance, the fifth transmitting portion (T5) having the fifth UV transmittance which is higher than the fourth UV transmittance, and the sixth transmitting portion (T6) having the sixth UV transmittance which is higher than the fifth UV transmittance. Under the condition that the second mask (M2) is disposed on the photoreactive organic film 290, it is irradiated with UV. For example, the fourth transmitting portion (T4) is positioned in the first subpixel (P1), the fifth transmitting portion (T5) is positioned in the second subpixel (P2), and the sixth transmitting portion (T6) is positioned in the third subpixel (P3). In this case, the amount of UV irradiation for the third subpixel (P3) is the largest, and the amount of UV irradiation for the first subpixel (P1) is the smallest (S203 of FIG. 9).

Figure 10D:
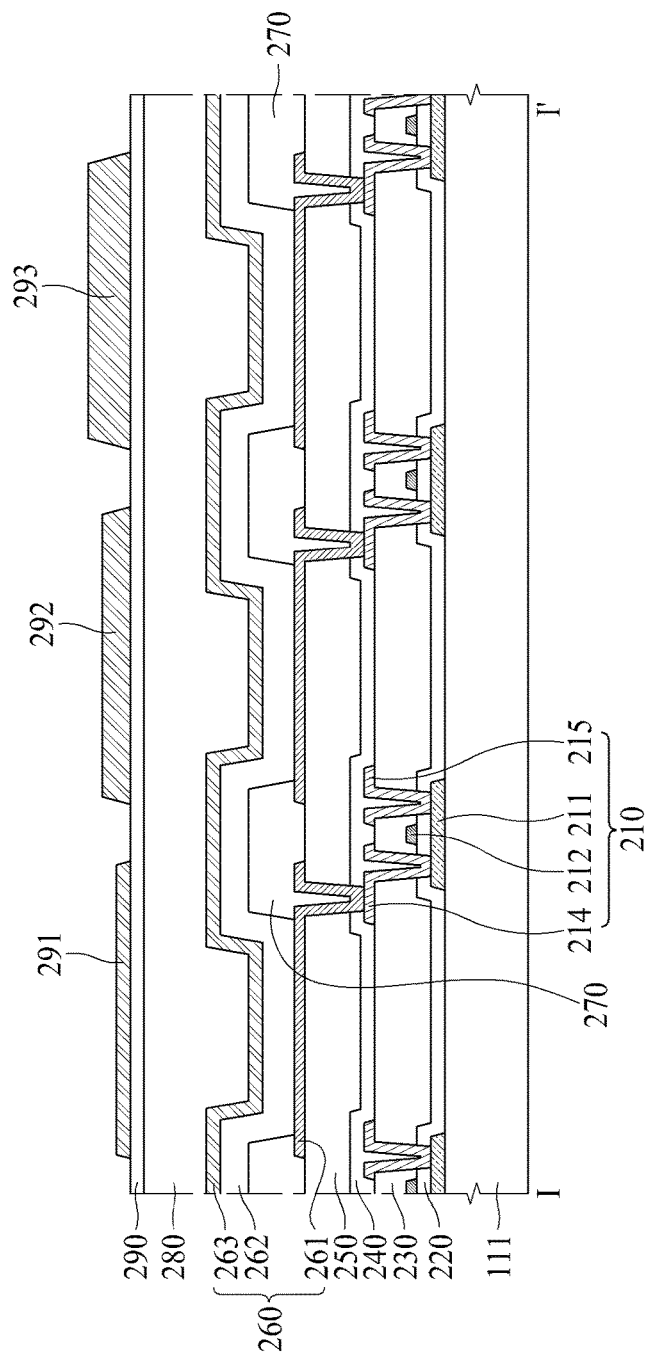

Fourthly, as shown in FIG. 10D, the first optical auxiliary layer 291 having a first thickness is provided in the first subpixel (P1), the second optical auxiliary layer 292 having a second thickness is provided in the second subpixel (P2), and the third optical auxiliary layer 293 having a third thickness is provided in the third subpixel (P3).

In detail, even though the substrate is subject to a blanket deposit process, the transparent conductive layer is actually deposited only on the area irradiated with UV, and the transparent conductive layer is not deposited on the area which is not irradiated with UV. Accordingly, even though an open mask having a transmitting portion for the display area is used instead of a mask having transmitting portions for the first to third subpixels (P1, P2, P3), the first to third optical auxiliary layers 291, 292, and 293 may be deposited on the photoreactive organic film 290 of the first to third subpixels (P1, P2, P3) irradiated with UV. That is, the first optical auxiliary layer 291 may be deposited on the first subpixel (P1), the second optical auxiliary layer 292 may be deposited on the second subpixel (P2), and the third optical auxiliary layer 293 may be deposited on the third subpixel (P3).

Also, it is possible to adjust the thickness of the transparent conductive layer deposited on the photoreactive organic film 290 in accordance with the amount of UV irradiation. According as the amount of UV irradiation is increased, the thickness of the transparent conductive layer deposited on the photoreactive organic film 290 becomes thicker. The amount of UV irradiation applied to the third subpixel (P3) is the largest, and the amount of UV irradiation applied to the first subpixel (P1) is the smallest. Thus, as shown in FIG. 10D, the third optical auxiliary layer 293 deposited on the third subpixel (P3) has the largest thickness, and the first optical auxiliary layer 291 deposited on the first subpixel (P1) has the smallest thickness.

As described above, the first optical auxiliary layer 291 of the first subpixel (P1), the second optical auxiliary layer 292 of the second subpixel (P2), and the third optical auxiliary layer 293 of the third subpixel (P3) may have the different thicknesses from one another by adjusting the amount of UV irradiation applied to the first to third subpixels (P1, P2, P3). Thus, it is possible to customize the micro-cavity distance in each of the first to third subpixels (P1, P2, P3) (S204 of FIG. 9) to a desired value.

Figure 10E:
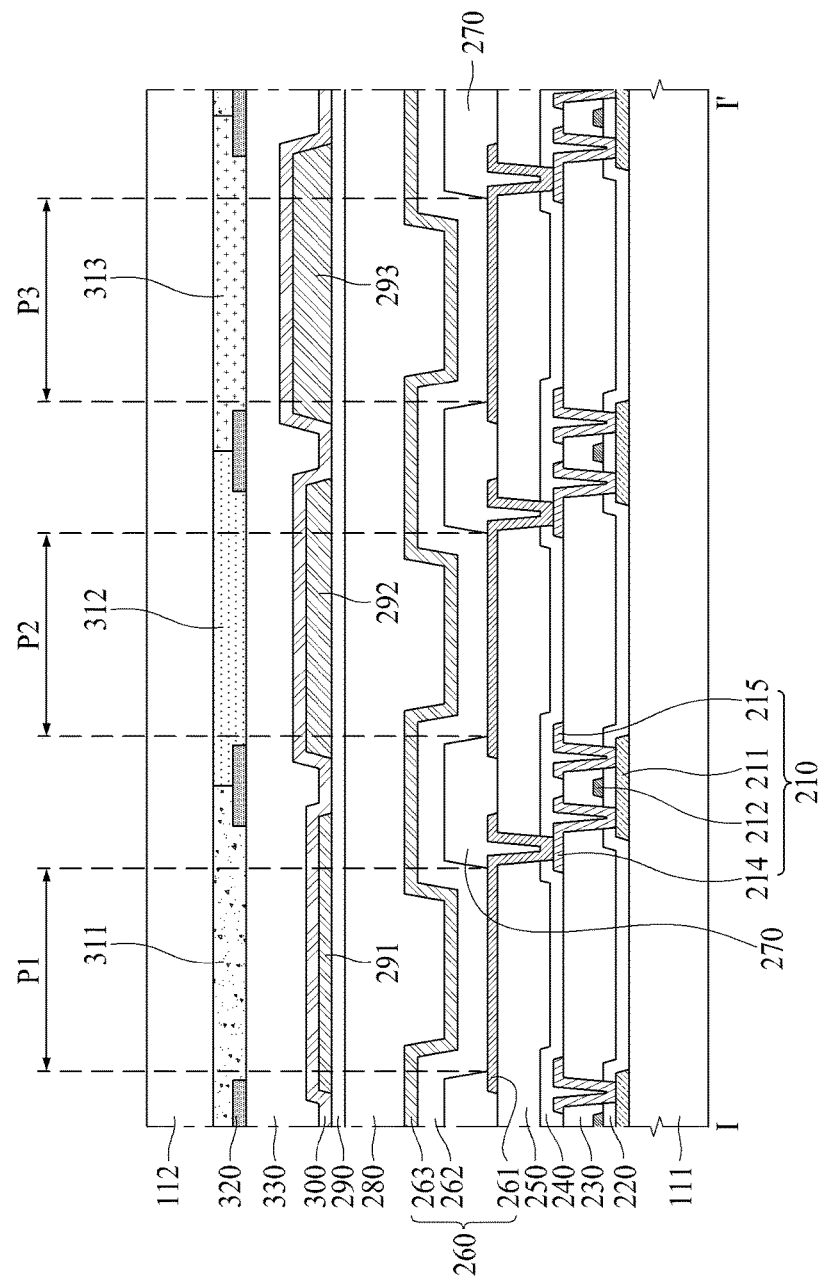

Fifthly, as shown in FIG. 10E, the semi-transmissive layer 300 is provided on the encapsulation film 280, and the first to third optical auxiliary layers 291, 292, and 293.

The step S205 of FIG. 9 is the same as the step S104 of FIG. 5, whereby a detailed description for the step S205 of FIG. 9 will be omitted (S205 of FIG. 9).

As described above, under the condition that the second mask (M2) having transmitting portions with the different UV transmittances is disposed on the photoreactive organic film 290, it is irradiated with UV so that the thickness of the first optical auxiliary layer 291 in the first subpixel (P1), the thickness of the second optical auxiliary layer 292 in the second subpixel (P2), and the thickness of the third optical auxiliary layer 293 in the third subpixel (P3) may be different from one another. As a result, it is possible to optimize the micro-cavity distance in each of the first to third subpixels (P1, P2, P3) by the three processes including the deposition process of the photoreactive organic film 290, the UV irradiation process, and the deposition process of the transparent conductive layer. Accordingly, it is possible to largely reduce the number of manufacturing process steps, to thereby simplify the manufacturing process, and to reduce a manufacturing cost.

Figure 11:
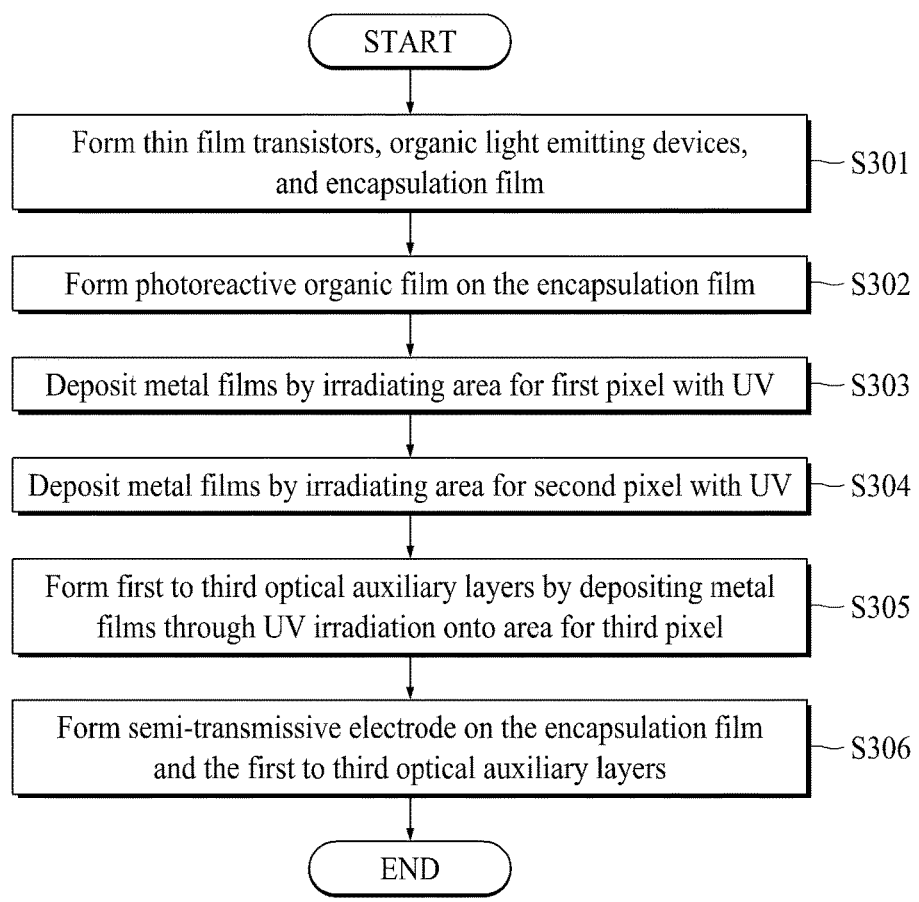
FIG. 11 is a flow chart illustrating a method for manufacturing an OLED device according to another embodiment of the present disclosure.

FIG. 11 is a flow chart illustrating a method for manufacturing an OLED device according to another embodiment of the present disclosure. FIGS. 12A to 12F are cross sectional views illustrating the method for manufacturing the OLED device according to another embodiment of the present disclosure.

The cross sectional views shown in FIGS. 12A to 12F relate to the method for manufacturing the above OLED device shown in FIG. 11, whereby the same reference numbers will be used throughout the drawings to refer to the same or like parts. Hereinafter, the method for manufacturing the OLED device according to another embodiment of the present disclosure will be described in detail with reference to FIG. 11 and FIGS. 12A to 12F.

Firstly, the thin film transistors 210, the organic light emitting devices 260, and the encapsulation film 280 are provided.

The step S301 of FIG. 11 is the same as the step S101 of FIG. 5, whereby a detailed description for the step S301 of FIG. 11 will be omitted (S301 of FIG. 11).

Secondly, the photoreactive organic film 290 is provided on the encapsulation film 280.

The step S302 of FIG. 11 is the same as the step S202 of FIG. 9, whereby a detailed description for the step S302 of FIG. 11 will be omitted (S302 of FIG. 11).

Figure 12A:
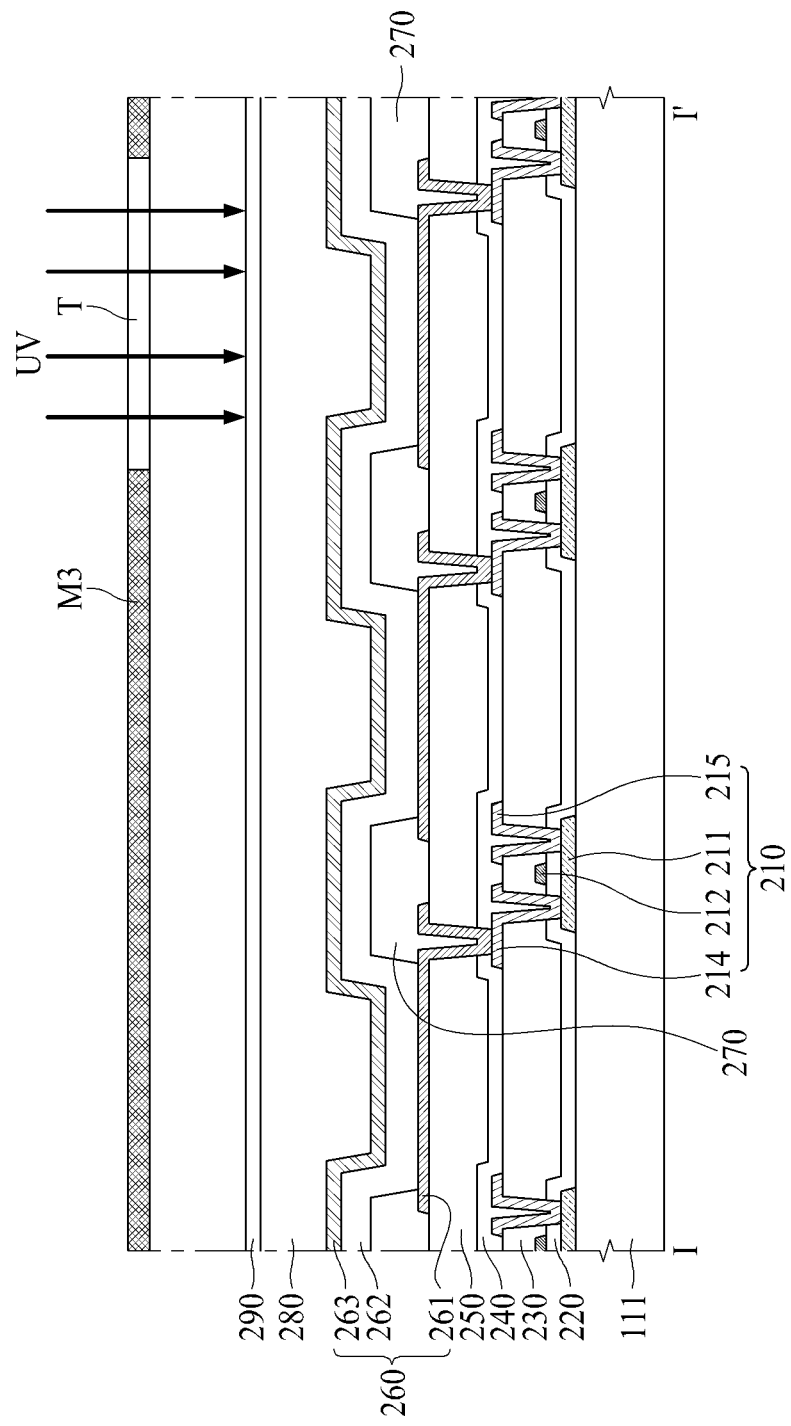
FIGS. 12A to 12F are cross sectional views illustrating the method for manufacturing the OLED device according to another embodiment of the present disclosure.
Figure 12B:
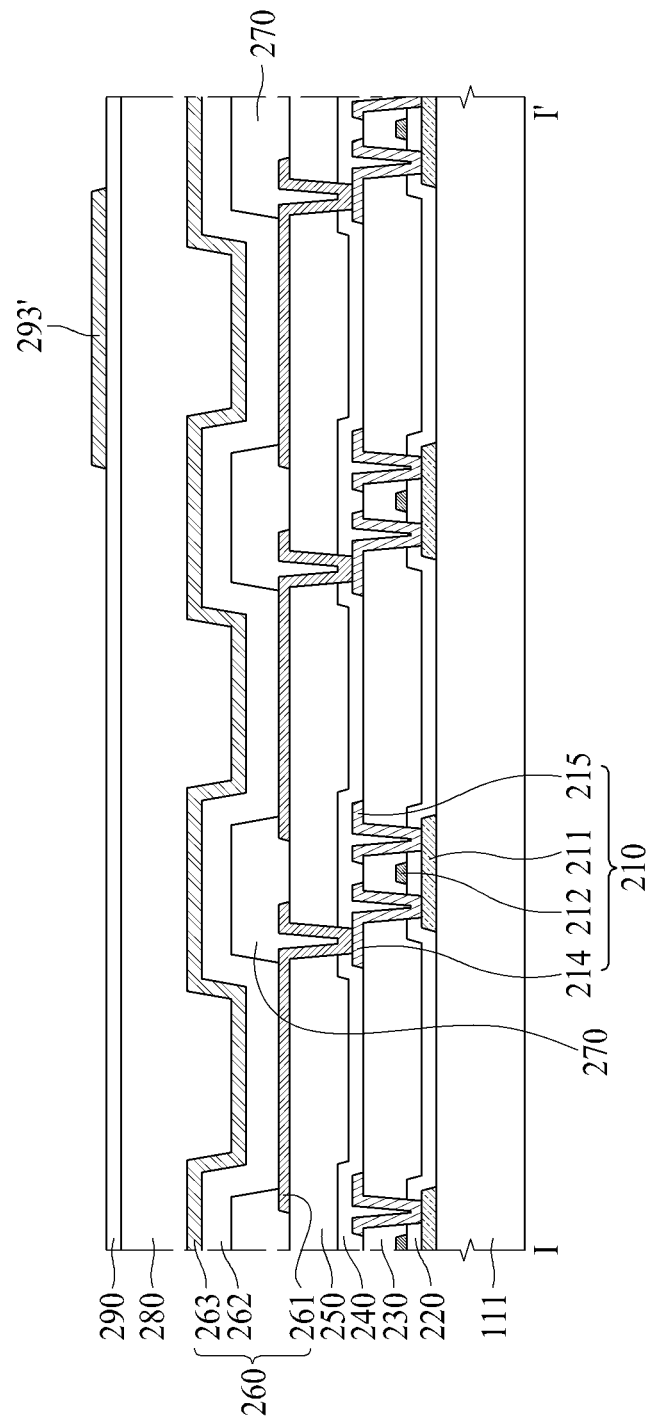

Thirdly, as shown in FIGS. 12A and 12B, the third subpixel area is irradiated with UV, to thereby form a third transparent conductive layer 293'.

In detail, as shown in FIG. 12A, under the condition that a third mask (M3) having a transmitting portion (T) is disposed on the photoreactive organic film 290, it is irradiated with UV. In this case, the transmitting portion (T) is positioned in the third subpixel area. The first and second subpixels (P1, P2) are not irradiated with UV, and only the third subpixel (P3) is irradiated with UV.

As shown in FIG. 8, the photoreactive organic film 290 includes diarylethene molecules. Thus, the third transparent conductive layer 293' is deposited only on the area of the photoreactive organic film 290 which is irradiated with UV, and the third transparent conductive layer 293' is not deposited on the area of the photoreactive organic film 290 which is not irradiated with UV. Accordingly, even though an open mask having a transmitting portion for the display area is used instead of a mask having transmitting portions for the third subpixel (P3), the third transparent conductive layer 293' may be deposited only on the third subpixel (P3) (S303 of FIG. 11).

Figure 12C:
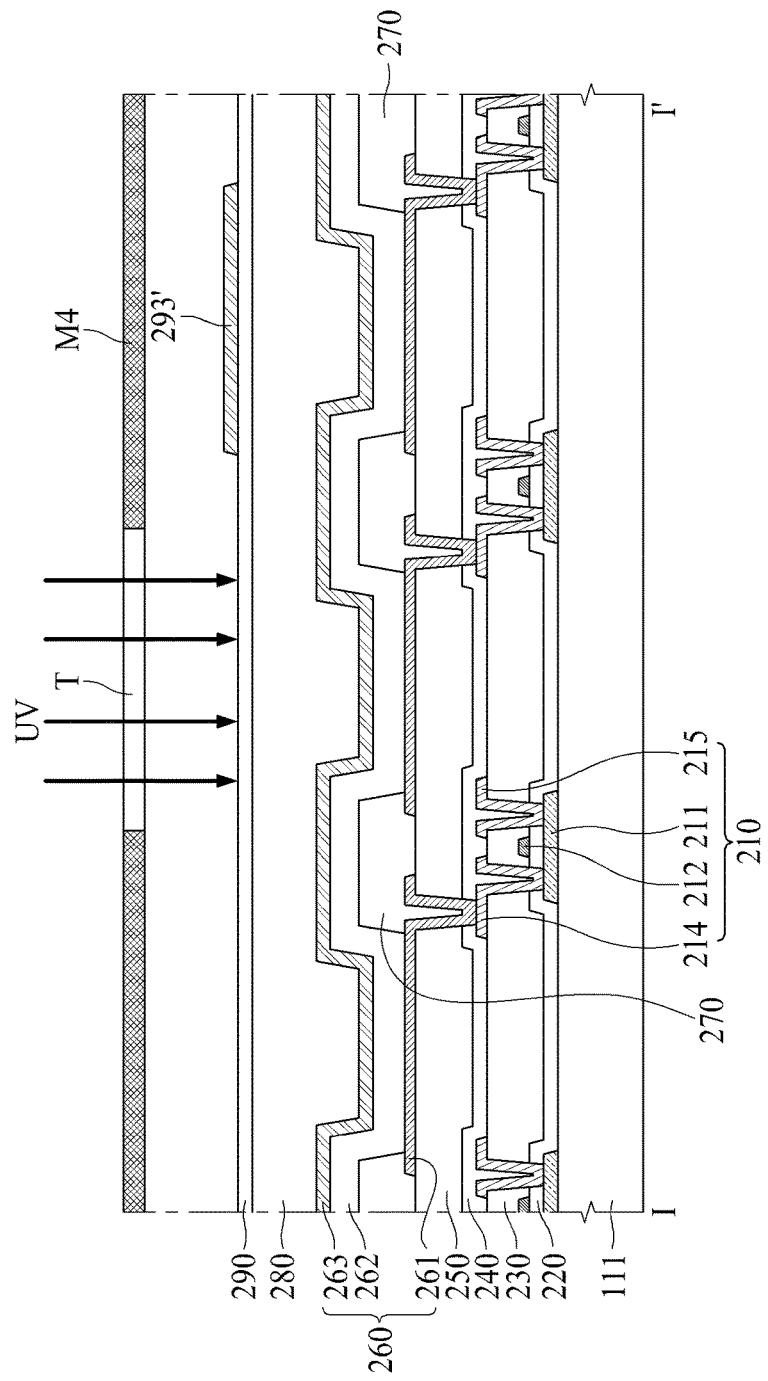
Figure 12D:
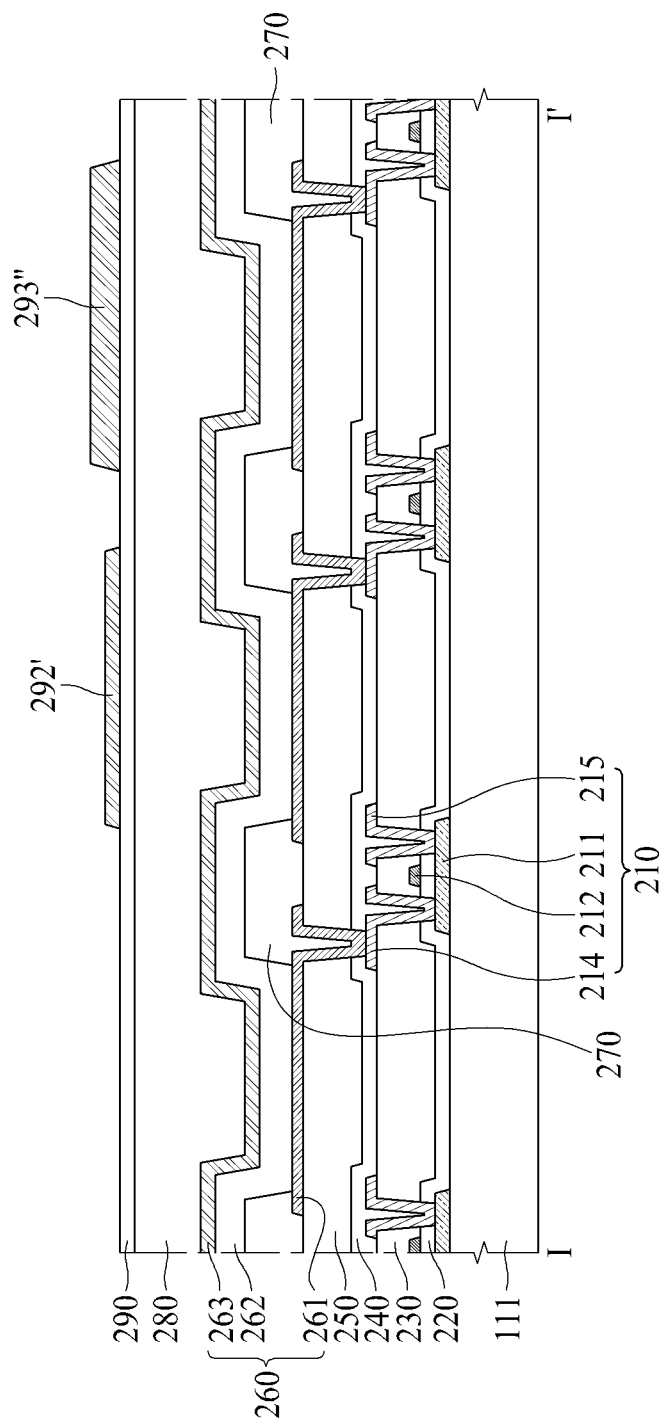

Fourthly, as shown in FIGS. 12C and 12D, the second subpixel area is irradiated with UV, to thereby form second and third transparent conductive layers 292' and 293". Namely, when the second transparent conductive layer 292' is deposited, then an additional thickness is applied on top of layer 293' to create layer 293".

In detail, as shown in FIG. 12C, under the condition that a fourth mask (M4) having a transmitting portion (T) is disposed on the photoreactive organic film 290, it is irradiated with UV. In this case, the transmitting portion (T) is positioned in the second subpixel area. The first and third subpixels (P1, P3) are not irradiated with UV, and only the second subpixel (P2) is irradiated with UV.

As shown in FIG. 8, the photoreactive organic film 290 includes diarylethene molecules. Thus, the transparent conductive layer is deposited only on the area of the photoreactive organic film 290 which is irradiated with UV, and the transparent conductive layer is not deposited on the area of the photoreactive organic film 290 which is not irradiated with UV. Accordingly, even though an open mask having a transmitting portion for the display area is used instead of a mask having transmitting portions for the second and third subpixels (P2, P3), as shown in FIG. 12D, the second and third transparent conductive layers 292' and 293" may be deposited on the second and third subpixels (P2, P3) irradiated with UV (S304 of FIG. 11).

Figure 12E:
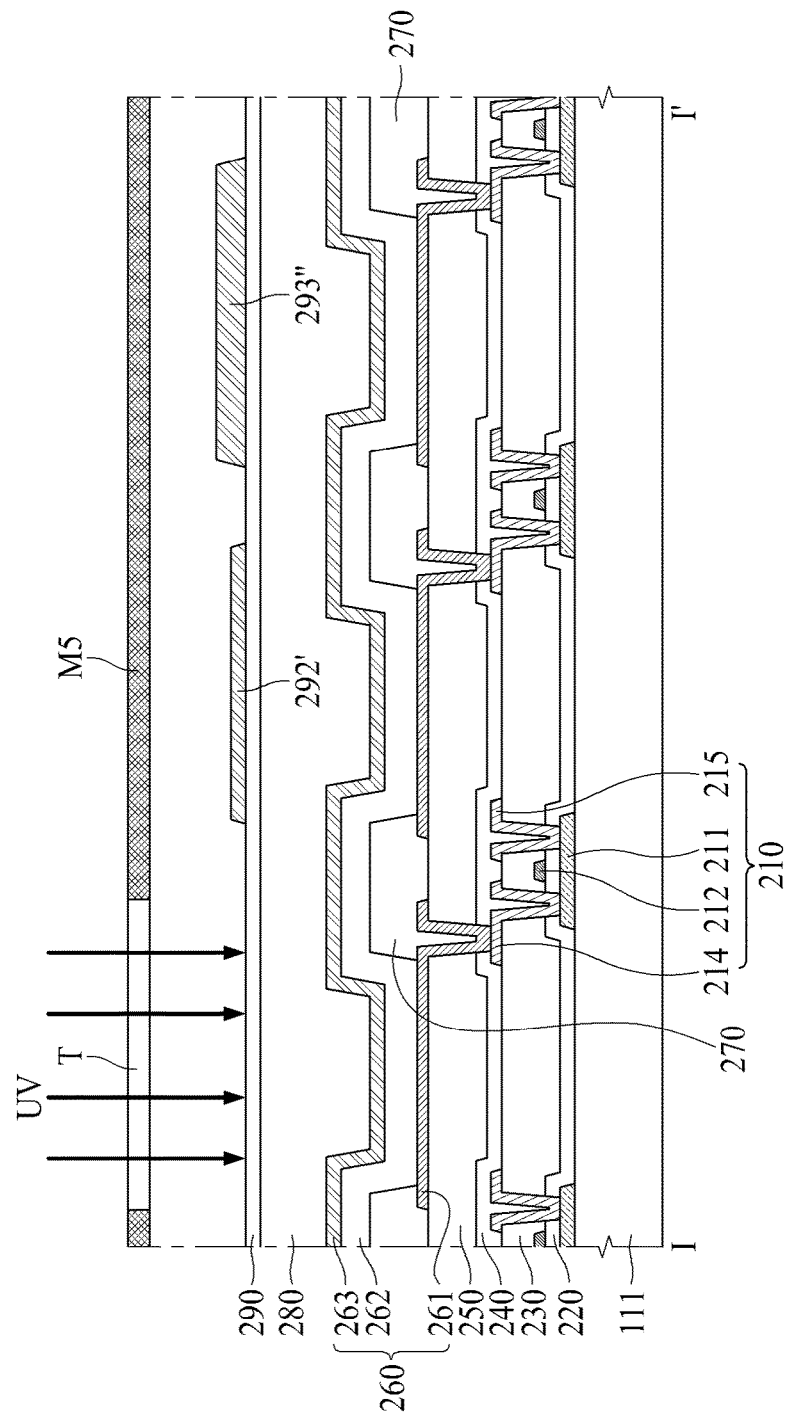
Figure 12F:
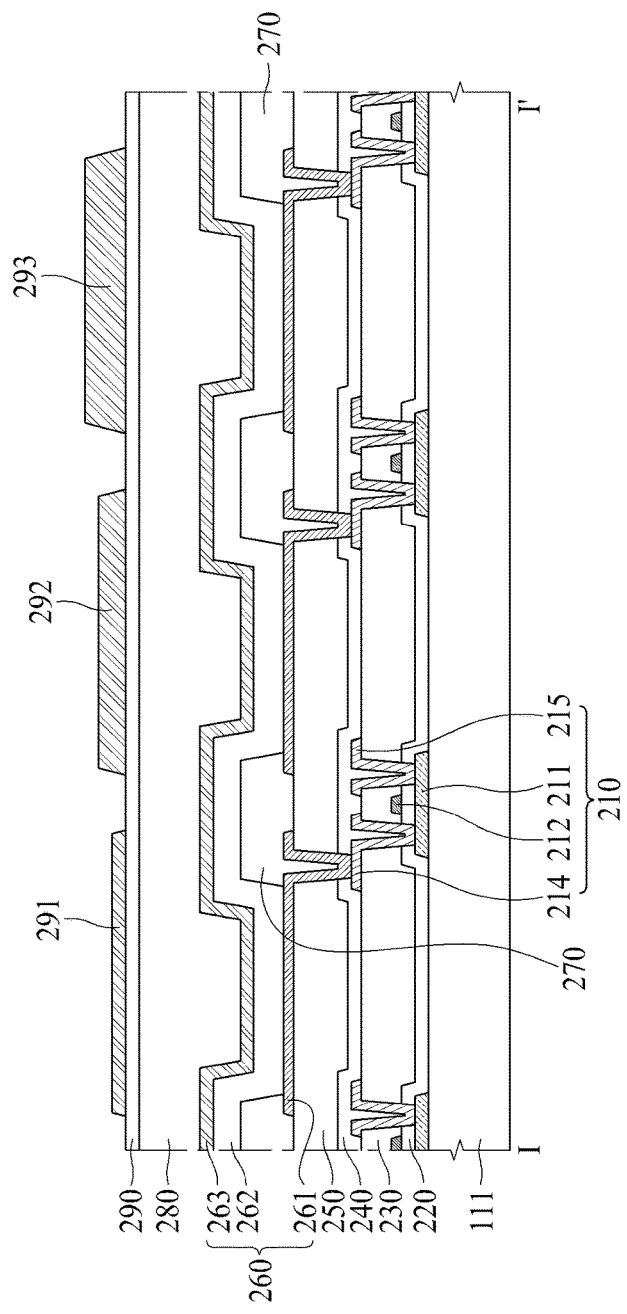

Fifthly, as shown in FIGS. 12E and 12F, the first subpixel area is irradiated with UV, to thereby form the first to third optical auxiliary layers 291, 292, and 293.

In detail, as shown in FIG. 12E, under the condition that a fifth mask (M5) having a transmitting portion (T) is disposed on the photoreactive organic film 290, it is irradiated with UV. In this case, the transmitting portion (T) is positioned in the first subpixel area. The second and third subpixels (P2, P3) are not irradiated with UV, and only the first subpixel (P1) is irradiated with UV.

As shown in FIG. 8, the photoreactive organic film 290 includes diarylethene molecules. Thus, the transparent conductive layer is deposited only on the area of the photoreactive organic film 290 which is irradiated with UV, and the transparent conductive layer is not deposited on the area of the photoreactive organic film 290 which is not irradiated with UV. Accordingly, even though an open mask having a transmitting portion for the display area is used instead of a mask having transmitting portions for the first to third subpixels (P1, P2, P3), as shown in FIG. 12F, the first to third optical auxiliary layers 291, 292, and 293 may be deposited on the first to third subpixels (P1, P2, P3) irradiated with UV.

Meanwhile, the transparent conductive layer is deposited on the photoreactive organic film 290 of the third subpixel (P3) by the steps of S302, S303, and S304, the transparent conductive layer is deposited on the photoreactive organic film 290 of the second subpixel (P2) by the steps of S303 and S304, and the transparent conductive layer is deposited on the photoreactive organic film 290 of the first subpixel (P1) by the steps of S304. Accordingly, the third optical auxiliary layer 293 of the third subpixel (P3) has the largest thickness, and the first optical auxiliary layer 291 of the first subpixel (P1) has the smallest thickness. That is, the thickness of the first optical auxiliary layer 291, the thickness of the second optical auxiliary layer 292, and the thickness of the third optical auxiliary layer 293 may be different from one another (S305 of FIG. 11).

Sixthly, the semi-transmissive layer 300 is provided on the photoreactive organic film 280, and the first to third optical auxiliary layers 291, 292, and 293.

The step S306 of FIG. 11 is the same as the step S104 of FIG. 5, whereby a detailed description for the step S306 of FIG. 11 will be omitted (S306 of FIG. 11).

As described above, after the third transparent conductive layer 293' is deposited by irradiating the third subpixel area with UV, the second and third transparent conductive layers 292' and 293" are deposited by irradiating the second subpixel area with UV, and then the first to third optical auxiliary layers 291, 292, and 293 are deposited by irradiating the first subpixel area with UV. As a result, the thickness of the first optical auxiliary layer 291 in the first subpixel (P1), the thickness of the second optical auxiliary layer 292 in the second subpixel (P2), and the thickness of the third optical auxiliary layer 293 in the third subpixel (P3) may be different from one another. As a result, it is possible to optimize the micro-cavity distance in each of the first to third subpixels (P1, P2, P3) by the seven processes including the deposition process of the photoreactive organic film 290, three times of the UV irradiation process, and three times of the deposition process of the transparent conductive layer. Accordingly, it is possible to largely reduce the number of manufacturing processes, to simplify the manufacturing process, and to reduce a manufacturing cost.

Figure 13:
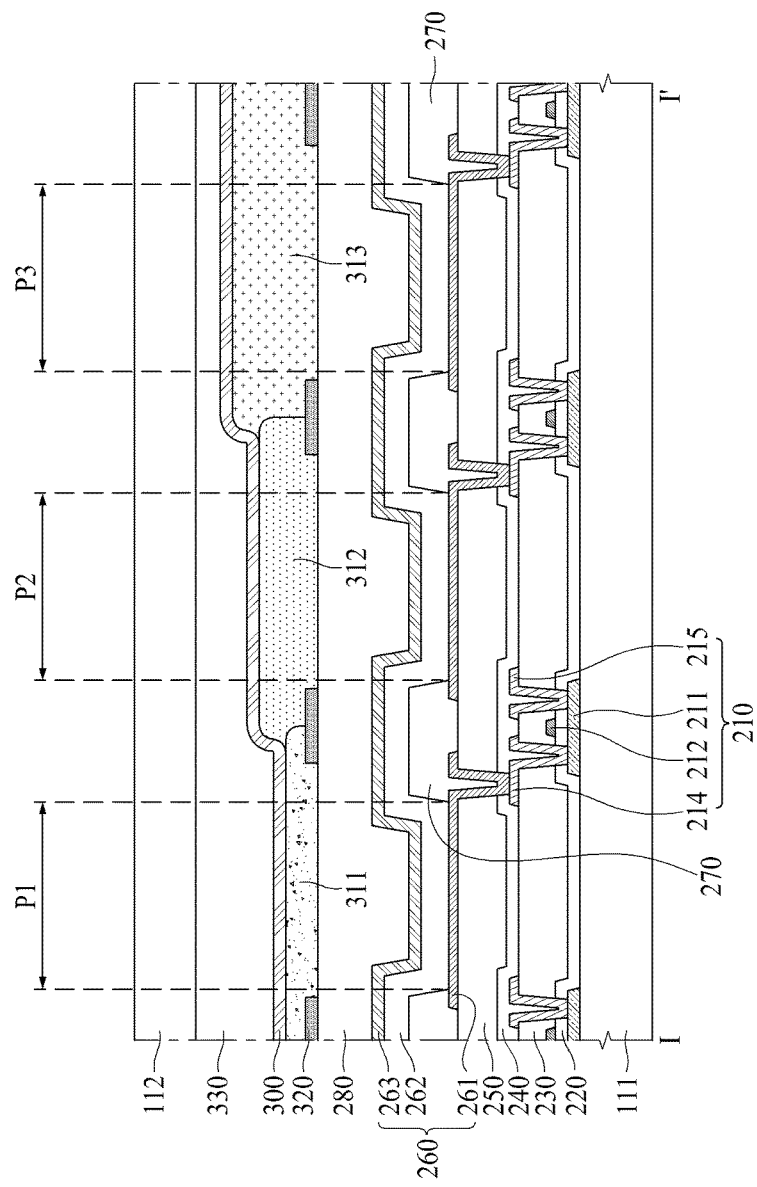
FIG. 13 is a cross sectional view showing another example along I-I' of FIG. 3.

FIG. 13 is a cross sectional view showing another example along I-I' of FIG. 3.

Except that first to third optical auxiliary layers 291, 292, and 293 are omitted, and color filters 311, 312, and 313 have the different thicknesses from one another, the cross sectional view shown in FIG. 13 is identical to the above cross sectional view shown in FIG. 4. In FIG. 13, a detailed description for the first substrate 111, the thin film transistor 210, the gate insulating film 220, the insulating interlayer 230, the protection film 240, the planarization film 250, the organic light emitting device 260, the bank 270, and the encapsulation film 280 will be omitted.

Referring to FIG. 13, the color filters 311, 312, and 313 and the black matrix 320 are provided on the encapsulation film 280. If the color filters 311, 312, and 313 and the black matrix 320 are provided on the encapsulation film 280 instead of the second substrate 112, there is no need for an alignment process when the first and second substrates 111 and 112 are bonded to each other, whereby it is possible to reduce a thickness of a display panel since there is no need for the additional adhesion layer.

The black matrix 320 may be disposed between each of the color filters 311, 312, and 313 so as to prevent light of any one pixel from being advancing toward the neighboring pixel and mixed with light of the neighboring pixel. Also, the black matrix 320 may be overlapped with the bank 270 corresponding to the non-emission area.

The respective color filters 311, 312, and 313 may be disposed in the pixels (P1, P2, P3). For example, as shown in FIG. 4, the first color filter 311 may be disposed in the first subpixel (P1), the second color filter 312 may be disposed in the second subpixel (P2), and the third color filter 313 may be disposed in the third subpixel (P3). The thickness of the first color filter 311, the thickness of the second color filter 312, and the thickness of the third color filter 313 may be different from one another. Each of the first to third color filters 311, 312, and 313 may be formed of an organic film including a predetermined-color pigment.

According to the embodiment of the present disclosure, the first electrode 261 is formed of the metal material with high reflectance, and the semi-transmissive layer 300 is formed of the semi-transmissive metal material, whereby it is possible to realize a micro-cavity structure by the first electrode 261 and the semi-transmissive layer 300, to thereby improve an emission efficiency of light emitted from the organic light emitting layer 262. Also, according to the embodiment of the present disclosure, the first color filter 311 of the first subpixel (P1), the second color filter 312 of the second subpixel (P2), and the third color filter 313 of the third subpixel (P3) have the different thicknesses from one another, whereby it is possible to optimize a micro-cavity distance in each of the first to third subpixels (P1, P2, P3).

The overcoat layer 330 may be provided on the color filters 311, 312, and 313 so as to planarize a step difference area caused by the color filters 311, 312, and 313.

Then, the second substrate 112 is disposed on the overcoat layer 330. The second substrate 112 may be a plastic film, a glass substrate, or an encapsulation film (protection film).

According to the embodiment of the present disclosure, the first electrode 261 is formed of the metal material with high reflectance, and the semi-transmissive layer 300 is formed of the semi-transmissive metal material, whereby it is possible to realize a micro-cavity structure by the first electrode 261 and the semi-transmissive layer 300, to thereby improve an emission efficiency of light emitted from the organic light emitting layer 262.

Also, according to the embodiment of the present disclosure, the first color filter 311 of the first subpixel (P1), the second color filter 312 of the second subpixel (P2), and the third color filter 313 of the third subpixel (P3) have the different thicknesses from one another, whereby it is possible to customize a micro-cavity distance in each of the first to third subpixels (P1, P2, P3).

In this embodiment of the present disclosure, the first color filter 311 has the smallest thickness, and the third color filter 313 has the largest thickness, but it is not limited to this structure. That is, the thickness in each of the first to third color filters 311, 312, and 313 may be designed to be within an optimum range through making various test structures and selecting a preferred thickness in consideration of a wavelength of the light emitted from the pixels, and a distance between the first electrode 261 and the semi-transmissive layer 300.

Figure 14:
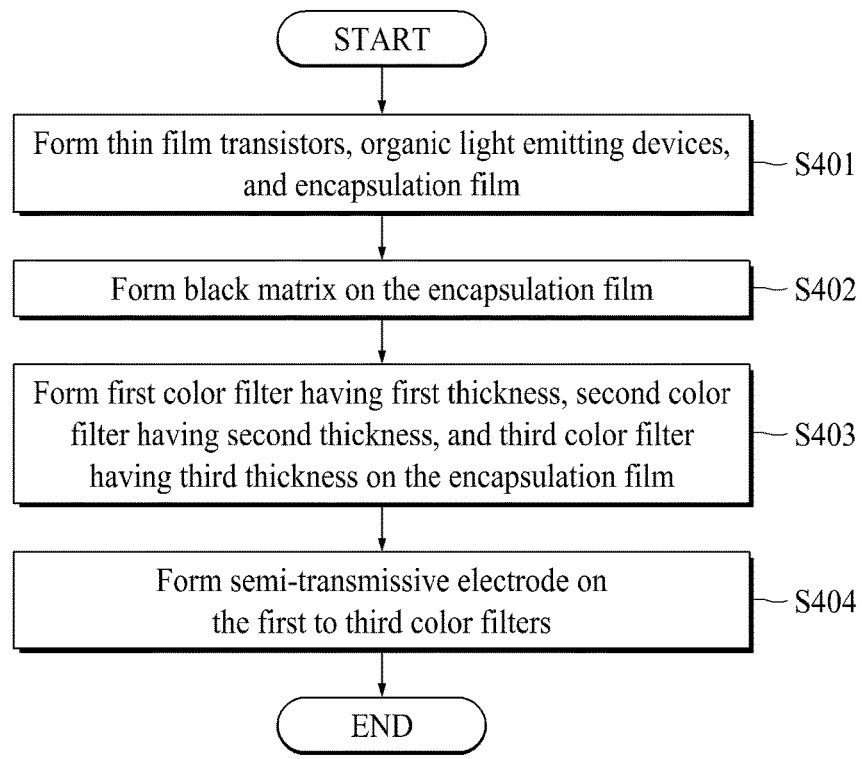
FIG. 14 is a flow chart illustrating a method for manufacturing an OLED device according to another embodiment of the present disclosure.

FIG. 14 is a flow chart illustrating a method for manufacturing an OLED device according to another embodiment of the present disclosure. FIGS. 15A to 15D are cross sectional views illustrating the method for manufacturing the OLED device according to another embodiment of the present disclosure.

The cross sectional views shown in FIGS. 15A to 15D relate to the method for manufacturing the above OLED device shown in FIG. 13, whereby the same reference numbers will be used throughout the drawings to refer to the same or like parts. Hereinafter, the method for manufacturing the OLED device according to another embodiment of the present disclosure will be described in detail with reference to FIG. 14 and FIGS. 15A to 15D.

Figure 15A:
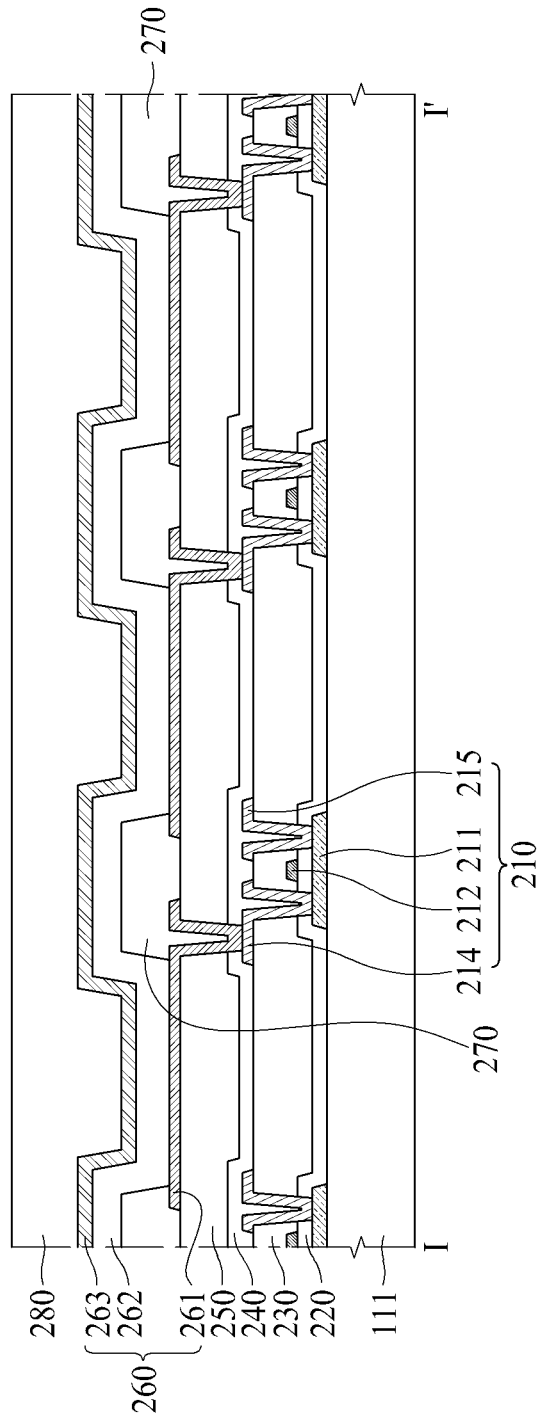
FIGS. 15A to 15D are cross sectional views illustrating the method for manufacturing the OLED device according to another embodiment of the present disclosure.

Firstly, as shown in FIG. 15A, the thin film transistors 210, the organic light emitting devices 260, and the encapsulation film 280 are provided.

The step S401 of FIG. 14 is the same as the step S101 of FIG. 5, whereby a detailed description for the step S401 of FIG. 14 will be omitted (S401 of FIG. 14).

Figure 15B:
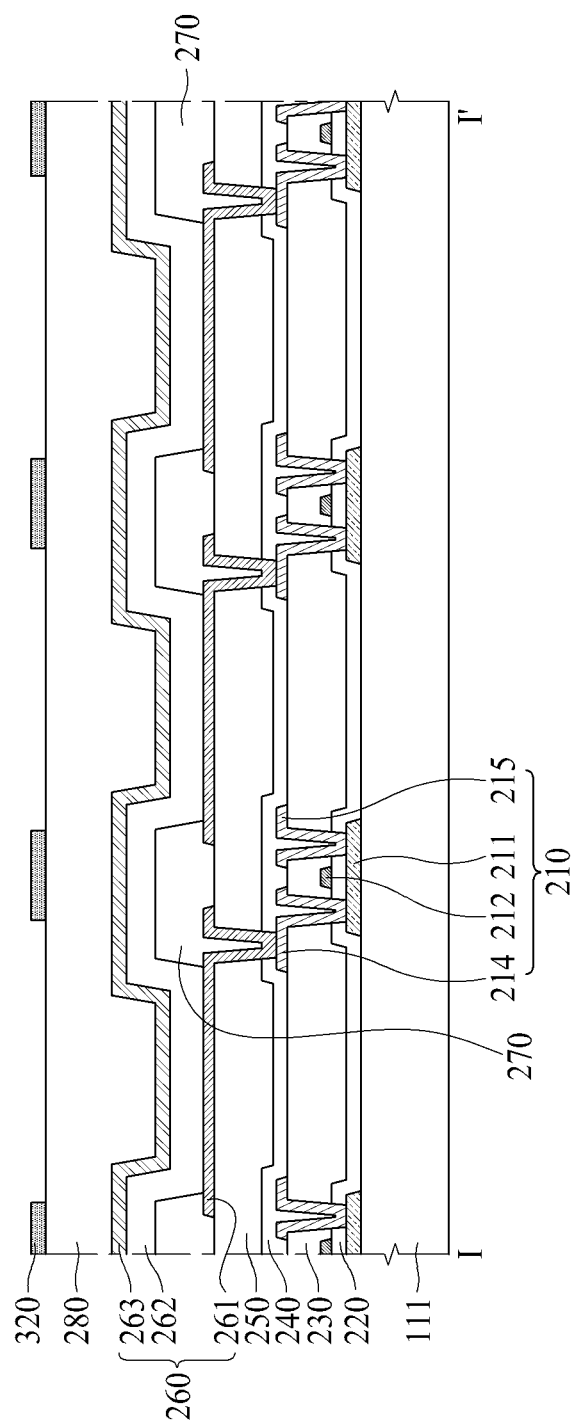

Secondly, as shown in FIG. 15B, the black matrix 320 is provided on the encapsulation film 280. The black matrix 320 may be overlapped with the bank 270 corresponding to the non-emission area.

If the black matrix 320 is formed of an organic film, it may include a carbon-based black pigment. For example, the black matrix 320 may be black-colored photoresist. In this case, the black-colored photoresist is coated onto the encapsulation film 280, and is then exposed and developed, to thereby form the black matrix 320 overlapped with the bank 270.

If the black matrix 320 is formed of an inorganic film, it may include an opaque metal material with high light-absorbing efficiency, for example, chrome (Cr). In this case, after the opaque metal material is deposited on the encapsulation film 280, a photoresist pattern is formed on the opaque metal material, and is then etched, to thereby form the black matrix 320 overlapped with the bank 270 (S402 of FIG. 14).

Figure 15C:
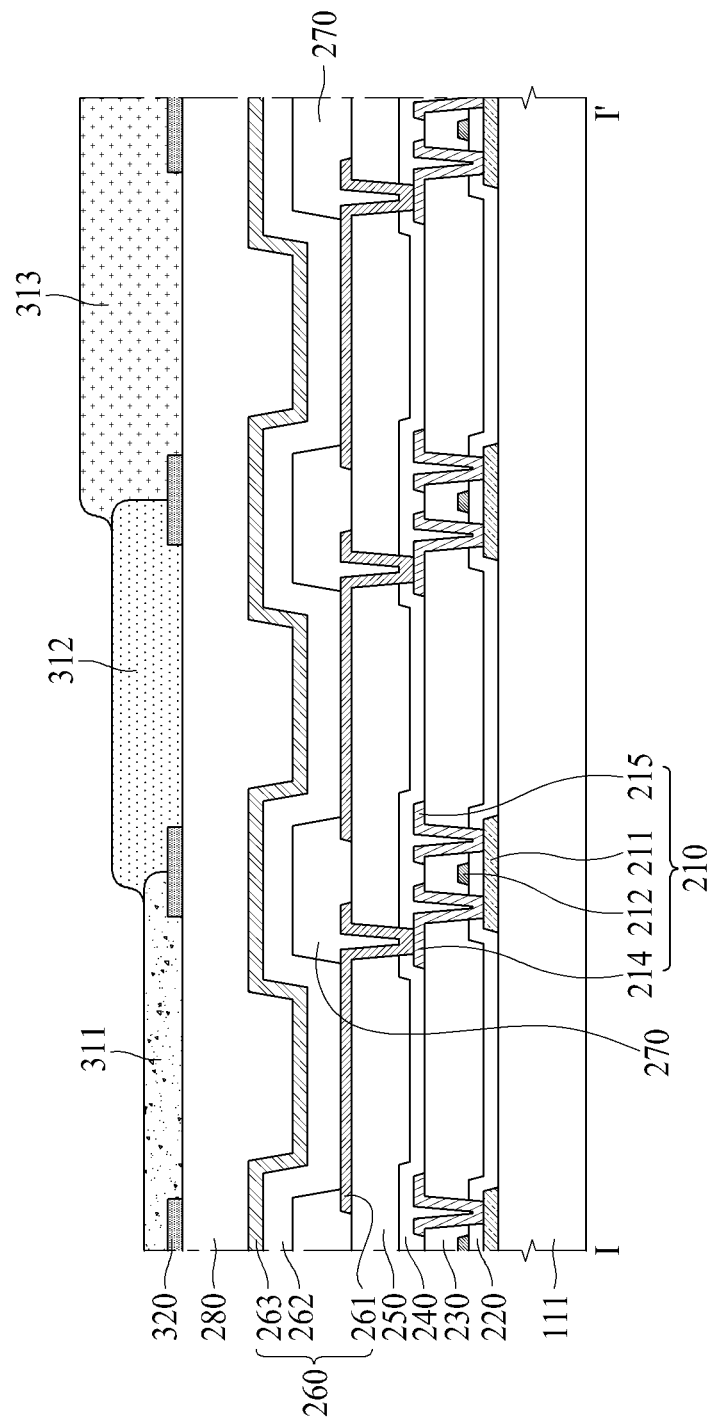

Thirdly, as shown in FIG. 15C, the first color filter 311 having a first thickness, the second color filter 312 having a second thickness, and the third color filter 313 having a third thickness are provided on the encapsulation film 280.

The first color filter 311 is provided on the encapsulation film 280 while overlying the first subpixel (P1). The first color filter 311 may be formed of an organic film having a first-color pigment. For example, the first color filter 311 may be first-color photoresist. In this case, the first-color photoresist is coated onto the encapsulation film 280, and is then exposed and developed, to thereby form the first color filter 311 overlying the first subpixel (P1).

The second color filter 312 is provided on the encapsulation film 280 while overlying the second subpixel (P2). The second color filter 312 may be formed of an organic film having a second-color pigment. For example, the first color filter 311 may be second-color photoresist. In this case, the second-color photoresist is coated onto the encapsulation film 280, and is then exposed and developed, to thereby form the second color filter 312 overlying the second subpixel (P2).

The third color filter 313 is provided on the encapsulation film 280 while overlying the third subpixel (P3). The third color filter 313 may be formed of an organic film having a third-color pigment. For example, the third color filter 313 may be third-color photoresist. In this case, the third-color photoresist is coated onto the encapsulation film 280, and is then exposed and developed, to thereby form the third color filter 313 overlying the third subpixel (P3).

According as an amount of UV irradiation applied to each of the first-color photoresist to third-color photoresist is changed, the first color filter 311, the second color filter 312, and the third color filter 313 may have the different thicknesses from one another. That is, some amount of each of the first-color photoresist to the third-color photoresist is removed to change the thickness of the photoresist (PR) based on it being irradiated with UV through the use of developing solution. Thus, if the amount of UV irradiation applied to the first-color photoresist is the largest, and the amount of UV irradiation applied to the third-color photoresist is the smallest, the first color filter 311 has the smallest thickness, and the third color filter 313 has the largest thickness.

As described above, the first color filter 311 of the first subpixel (P1), the second color filter 312 of the second subpixel (P2), and the third color filter 313 of the third subpixel (P3) have the different thicknesses from one another by adjusting the amount of UV irradiation applied to each of the first to third subpixels (P1, P2, P3). Accordingly, it is possible to custom create a micro-cavity distance in each of the first to third subpixels (P1, P2, P3) (S403 of FIG. 14).

Figure 15D:
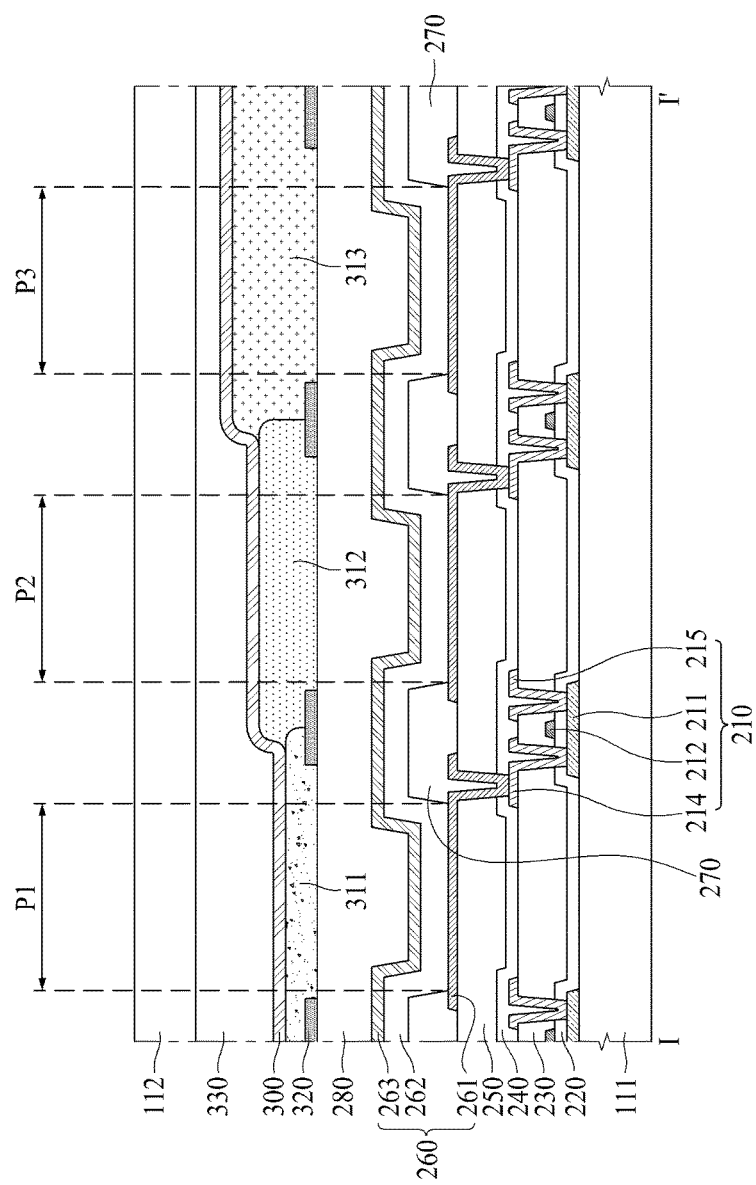

Fourthly, as shown in FIG. 15D, the semi-transmissive layer 300 is provided on the first to third color filters 311, 312, and 313.

The semi-transmissive layer 300 may be formed of a semi-transmissive conductive material such as magnesium (Mg), argentums (Ag), or alloy of magnesium (Mg) and argentums (Ag).

Thereafter, the overcoat layer 330 may be provided on the semi-transmissive layer 300 so as to planarize a step difference area caused by the color filters 311, 312, and 313.

Then, the second substrate 112 is disposed on the overcoat layer 330. The second substrate 112 may be a plastic film, a glass substrate, or an encapsulation film (protection film) (S404 of FIG. 14).

According to the embodiment of the present disclosure, the first color filter 311 of the first subpixel (P1), the second color filter 312 of the second subpixel (P2), and the third color filter 313 of the third subpixel (P3) have the different thicknesses from one another on the encapsulation film 280, whereby it is possible to optimize a micro-cavity distance in each of the first to third subpixels (P1, P2, P3) by a related art color filter process. Thus, it is possible to largely reduce the number of manufacturing processes, to thereby simplify the manufacturing process, and to reduce the manufacturing cost.

According to the present disclosure, the first electrode 261 is formed of the metal material with high reflectance, and the semi-transmissive layer 300 is formed of the semi-transmissive metal material, whereby it is possible to realize the micro-cavity structure by the first electrode 261 and the semi-transmissive layer 300, to thereby improve the emission efficiency of light emitted from the organic light emitting layer 262.

Also, the first optical auxiliary layer 291 of the first subpixel (P1), the second optical auxiliary layer 292 of the second subpixel (P2), and the third optical auxiliary layer 293 of the third subpixel (P3) have the different thicknesses from one another, whereby it is possible to optimize the micro-cavity distance in each of the first to third subpixels (P1, P2, P3).

Accordingly, the photoresist coating process and the patterning process are additionally carried out so that the first optical auxiliary layer 291 of the first subpixel (P1), the second optical auxiliary layer 292 of the second subpixel (P2), and the third optical auxiliary layer 293 of the third subpixel (P3) have the different thicknesses from one another. Thus, it is possible to largely reduce the number of manufacturing processes, to thereby simplify the manufacturing process, and to reduce the manufacturing cost.

According to the embodiment of the present disclosure, the deposition process of the photoreactive organic film 290, the UV irradiation process, and the deposition process of the transparent conductive layer are additionally carried out so that the first optical auxiliary layer 291 of the first subpixel (P1), the second optical auxiliary layer 292 of the second subpixel (P2), and the third optical auxiliary layer 293 of the third subpixel (P3) have the different thicknesses from one another. Thus, it is possible to largely reduce the number of manufacturing processes, to thereby simplify the manufacturing process, and to reduce the manufacturing cost.

According to the embodiment of the present disclosure, the first color filter 311 of the first subpixel (P1), the second color filter 312 of the second subpixel (P2), and the third color filter 313 of the third subpixel (P3) may have the different thicknesses from one another. Thus, it is possible to optimize the micro-cavity distance in each of the first to third subpixels (P1, P2, P3).

Furthermore, the first color filter 311 of the first subpixel (P1), the second color filter 312 of the second subpixel (P2), and the third color filter 313 of the third subpixel (P3) have the different thicknesses from one another by a related art color filter process. Thus, it is possible to largely reduce the number of manufacturing processes, to thereby simplify the manufacturing process, and to reduce the manufacturing cost.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display (OLED) device comprising:
a pixel having a first, second and third subpixel,
wherein each of the first, second and third subpixels includes:
a first electrode;
an organic light emitting layer disposed on the first electrode;
a second electrode including a transparent metal material disposed on the organic light emitting layer;
a planarizing encapsulation film for covering the second electrode, the planarizing encapsulation film being a non-conformal layer having a varying thickness and having a planar upper surface that is co-planar for the entire upper surface within the pixel;
a first optical auxiliary layer disposed on the planar upper surface of the encapsulation film in a location overlying the first subpixel, the first optical auxiliary layer having a first thickness;
a second optical auxiliary layer disposed on the planar upper surface of the encapsulation film in a location adjacent to the first optical auxiliary layer and overlying the second subpixel, the second optical auxiliary layer having a second thickness greater than the first thickness;
a third optical auxiliary layer disposed on the planar upper surface of the encapsulation film in a location adjacent to the second optical auxiliary layer and overlying the third subpixel, the third optical auxiliary layer having a third thickness greater than the second thickness;
a semi-transmissive electrode disposed overlying each of the respective first, second and third optical auxiliary layers;
a planarizing layer overlying the a semi-transmissive electrode, the planarizing layer being a non-conformal layer having a varying thickness and having a planar upper surface that is co-planar for the entire upper surface within the pixel;
a first color filter positioned on the upper surface of the planarizing layer at a locations overlying the first subpixel and having a constant thickness for its entire length;
a second color filter positioned on the upper surface of the planarizing layer at a location overlying the second subpixel and having a constant thickness for its entire length; and
a third color filter positioned on the upper surface of the planarizing layer at a location overlying the second subpixel and having a constant thickness for its entire length;
wherein the first, second and third optical auxiliary layers cause a first distance between the first electrode and the semi-transmissive electrode in the first subpixel, a second distance between the first electrode and the semi-transmissive electrode in the second subpixel, and a third distance between the first electrode and the semi-transmissive electrode in the third subpixel are different from one another.

2. The OLED device according to claim 1, wherein each of the first, second and third optical auxiliary layers is composed of a layer containing a photoresist.

3. An OLED device, comprising:
a pixel having a first, second and third subpixel,
wherein each of the first, second and third subpixels includes:
a first electrode;
an organic light emitting layer disposed on the first electrode;
a second electrode including a transparent metal material disposed on the organic light emitting layer;

a planarizing encapsulation film for covering the second electrode the planarizing encapsulation film being a non-conformal layer having a varying thickness and having a planar upper surface that is co-planar for the entire upper surface within the pixel;
a first optical auxiliary layer composed of a photoreactive film, the first auxiliary layer disposed on the upper surface of the encapsulation film in a location overlying the first subpixel, the first optical auxiliary layer having a first thickness for its entire length and width;
a second optical auxiliary layer composed of a photoreactive film, the second auxiliary layer disposed on the encapsulation film in a location adjacent to the first optical auxiliary layer and overlying the second subpixel, the second optical auxiliary layer having a second thickness for its entire length and width that is greater than the first thickness;
a third optical auxiliary layer composed of a photoreactive film, the third disposed on the encapsulation film in a location adjacent to the second optical auxiliary layer and overlying the third subpixel, the third optical auxiliary layer having a third thickness for its entire length and width that is greater than the second thickness; and
a semi-transmissive electrode disposed overlying each of the respective first, second and third optical auxiliary layers.

4. The OLED device according to claim 3, wherein the photoreactive film includes diarylethene molecules.

5. The OLED device according to claim 3, wherein each of the first, second and third optical auxiliary layers is composed of a layer containing a transparent metal material.

6. The OLED device according to claim 3, further comprising:
a first color filter disposed overlying the first subpixel on the encapsulation film in a first subpixel area;
a second color filter disposed overlying the second subpixel on the encapsulation film in a second subpixel area; and
a third color filter disposed overlying the third subpixel on the encapsulation film in a third subpixel area.

7. An OLED device, comprising:
a pixel having a first, second and—third subpixel,
wherein each of the first, second and—third subpixels includes:
a first electrode;
an organic light emitting layer disposed on the first electrode;
a second electrode including a transparent metal material disposed on the organic light emitting layer;
a planarizing encapsulation film for covering the second electrode the planarizing encapsulation film being a non-conformal layer having a varying thickness and having a planar upper surface that is co-planar for the entire upper surface within the pixel; and
a first color filter disposed overlying the first subpixel on the encapsulation film in a first subpixel area, the first color filter having a first uniform thickness for its entire length and width;
a second color filter disposed overlying the second subpixel on the encapsulation film in a second subpixel area, the second color filter having a second uniform thickness for its entire length and width; and
a third color filter disposed overlying the third subpixel on the encapsulation film in a third subpixel area, the third color filter having a third uniform thickness for its entire length and width; and
a semi-transmissive electrode disposed overlying the first, second and third color filters,—wherein there is a first distance between the first electrode and the semi-transmissive electrode in the first subpixel, there is a second distance between the first electrode and the semi-transmissive electrode in the second subpixel, and there is a third distance between the first electrode and the semi-transmissive electrode in the third subpixel are different from one another.

8. The OLED device according to claim 7, wherein the semi-transmissive electrode is disposed directly on the first, second and third color filters.

9. A method for manufacturing an OLED device, comprising:
forming first electrodes in first, second and third subpixel areas on a first substrate, each of the first electrodes being electrically isolated from each other;
forming an organic light emitting layer on the first electrodes;
forming a second electrode on the organic light emitting layer overlying each of the first, second and third subpixel areas;
forming a planarizing encapsulation film as a non-conformal layer having a varying thickness that is co-planar for the entire upper surface within the pixel on the second electrode, the planarizing encapsulation film having a planar upper surface;
forming a first optical auxiliary layer having a first thickness for its entire length and width in the first subpixel area on the planar upper surface of the encapsulation film;
forming a second optical auxiliary layer having a second thickness greater than the first thickness for its entire length and width in the second subpixel area on the planar upper surface of the encapsulation film;
forming a third optical auxiliary layer having a third thickness greater than the second thickness for its entire length and width in the third subpixel area on the planar upper surface of the encapsulation film;
forming a semi-transmissive electrode on the first, second and third optical auxiliary layers;
forming a planarizing layer as a non-conformal layer having a varying thickness that is co-planar for the entire upper surface within the pixel on the semi-transmissive electrode, the planarizing layer having a planar upper surface; and
forming color filters on the planarizing layer overlying the respective first, second and third subpixel areas.

10. The method according to claim 9 wherein the steps of forming a first optical auxiliary layer having a first thickness in the first subpixel area, a second optical auxiliary layer having a second thickness in the second subpixel area, and a third optical auxiliary layer having a third thickness in the third subpixel area is carried out by:
coating the encapsulation film with a photoreactive film that has a uniform thickness over each of the first, second and third pixel areas;
disposing a mask having first, second and third light transmitting portions on the photoreactive film, the first transmitting portion having a first UV transmittance being positioned overlying a first subpixel area, the second transmitting portion having a second UV transmittance that is lower than the first UV transmittance, being positioned overlying a second subpixel area, and the third transmitting portion having a third UV transmittance that is lower than the second UV transmittance, being positioned overlying a third subpixel area;

irradiating the entire photoreactive film overlying the first, second and third pixel areas at the same time in the same process step through the mask using UV light; and developing the photoreactive film at the same time to form each of the first, second and third optical auxiliary layers.

11. The method according to claim 10 wherein the steps of forming the first optical auxiliary layer having the first thickness disposed overlying the first subpixel on the photoreactive organic film in the first subpixel, forming the second optical auxiliary layer having the second thickness disposed overlying the second subpixel on the photoreactive organic film in the second subpixel, and forming theft third optical auxiliary layer having theft third thickness disposed overlying the third subpixel on the photoreactive organic film in the third subpixel are carried out by a step comprising:

exposing the photoreactive organic film to different amounts of UV radiation in each of the regions that overlay the first, second and third subpixel regions, respectively.

12. The method according to claim 9 further including:

depositing different thickness of the optical auxiliary layer in each of the first, second and third regions to form the first optical auxiliary layer, the second optical auxiliary layer and the third optical auxiliary layer.

13. The method according to claim 12 further including:

depositing the different thickness of the first, second and third optical layers at three different times, in sequence.

14. The method according to claim 12 further including:

depositing a first thickness in the first region and not depositing any in the second and third regions; and depositing a second thickness in the second region and depositing the second thickness also in the first region to create thicker layer in the first region.

15. The method according to claim 9 wherein the optical auxiliary layer is composed of a layer containing a metal.

16. The method according to claim 9 wherein the optical auxiliary layer is composed of a layer containing a photoresist.

* * * * *

UNITED STATES PATENT AND TRADEMARK OFFICE
CERTIFICATE OF CORRECTION

PATENT NO. : 10,388,703 B2
APPLICATION NO. : 15/816886
DATED : August 20, 2019
INVENTOR(S) : TaeHan Park Page 1 of 1

It is certified that error appears in the above-identified patent and that said Letters Patent is hereby corrected as shown below:

In the Claims

Column 26, Claim 1, Line 37:
"at a locations" should be: -- at a location --.

Column 27, Claim 7, Line 44:
"and—third" should be: -- and third --.

Column 27, Claim 7, Line 45:
"and—third" should be: -- and third --.

Column 28, Claim 7, Line 4:
"filters,—wherein" should be: -- filters, wherein --.

Column 29, Claim 11, Line 15:
"forming theft third" should be: -- forming the third --.

Column 29, Claim 11, Line 16:
"having theft third" should be: -- having the third --.

Signed and Sealed this
First Day of September, 2020

Andrei Iancu
*Director of the United States Patent and Trademark Office*